(12) United States Patent
Sasaki et al.

(10) Patent No.: US 8,358,015 B2
(45) Date of Patent: Jan. 22, 2013

(54) LAYERED CHIP PACKAGE AND METHOD OF MANUFACTURING SAME

(75) Inventors: Yoshitaka Sasaki, Santa Clara, CA (US); Hiroyuki Ito, Milpitas, CA (US); Hiroshi Ikejima, Hong Kong (CN); Atsushi Iijima, Hong Kong (CN)

(73) Assignees: Headway Technologies, Inc., Milpitas; SAE Magnetics (H.K.) Ltd., Hong Kong (CN)

( * ) Notice: Subject to any disclaimer, the term of this patent is extended or adjusted under 35 U.S.C. 154(b) by 46 days.

(21) Appl. No.: 13/156,941

(22) Filed: Jun. 9, 2011

(65) Prior Publication Data
US 2012/0313260 A1   Dec. 13, 2012

(51) Int. Cl.
 H01L 23/48 (2006.01)
 H01L 23/52 (2006.01)
 H01L 29/40 (2006.01)
(52) U.S. Cl. .......................... 257/777; 257/774; 438/113
(58) Field of Classification Search .................. 257/774, 257/777, E21.599; 438/107, 109, 113
See application file for complete search history.

(56) References Cited

U.S. PATENT DOCUMENTS

| | | | |
|---|---|---|---|
| 5,953,588 A | 9/1999 | Camien et al. | |
| 7,127,807 B2 | 10/2006 | Yamaguchi et al. | |
| 7,745,259 B2 | 6/2010 | Sasaki et al. | |
| 7,863,095 B2 | 1/2011 | Sasaki et al. | |
| 7,868,442 B2 | 1/2011 | Sasaki et al. | |
| 7,915,079 B1 * | 3/2011 | Sasaki et al. | 438/107 |
| 8,253,257 B2 * | 8/2012 | Sasaki et al. | 257/777 |
| 2007/0165461 A1 | 7/2007 | Cornwell et al. | |
| 2008/0179728 A1 | 7/2008 | Ikeda | |

FOREIGN PATENT DOCUMENTS
JP   A-2003-163324   6/2003

OTHER PUBLICATIONS

Gann, Keith D., "Neo-Stacking Technology," *HDI Magazine*, Dec. 1999, Miller Freeman, Inc. 1999.
U.S. Appl. No. 12/875,710, filed Sep. 3, 2010 in the name of Sasaki et al.
U.S. Appl. No. 13/156,808, filed Jun. 9, 2011 in the name of Sasaki et al.
U.S. Appl. No. 12/902,600, filed Oct. 12, 2010 in the name of Sasaki et al.
U.S. Appl. No. 12/896,283, filed Oct. 1, 2010 in the name of Sasaki et al.

\* cited by examiner

*Primary Examiner* — Phuc Dang
(74) *Attorney, Agent, or Firm* — Oliff & Berridge, PLC

(57) ABSTRACT

A layered chip package includes a main body and wiring. The main body includes: a main part having a top surface and a bottom surface and including three or more layer portions stacked on one another; a plurality of first terminals disposed on the top surface of the main part; and a plurality of second terminals disposed on the bottom surface of the main part. Each layer portion includes a semiconductor chip having first and second surfaces, and a plurality of electrodes electrically connected to the wiring. The plurality of electrodes are disposed on a side of the first surface of the semiconductor chip. A first layer portion located closest to the top surface of the main part and a second layer portion located closest to the bottom surface of the main part are arranged so that the second surfaces of their respective semiconductor chips face toward each other. The plurality of first terminals are formed by using the plurality of electrodes of the first layer portion. The plurality of second terminals are formed by using the plurality of electrodes of the second layer portion.

8 Claims, 25 Drawing Sheets

LAYERED CHIP PACKAGE AND METHOD OF MANUFACTURING SAME

BACKGROUND OF THE INVENTION

1. Field of the Invention

The present invention relates to a layered chip package that includes a plurality of semiconductor chips stacked, and to a method of manufacturing the same.

2. Description of the Related Art

In recent years, lighter weight and higher performance have been demanded of portable devices typified by cellular phones and notebook personal computers. Accordingly, there has been a need for higher integration of electronic components for use in the portable devices. With the development of image- and video-related equipment such as digital cameras and video recorders, semiconductor memories of larger capacity and higher integration have also been demanded.

As an example of highly integrated electronic components, a system-in-package (hereinafter referred to as SiP), especially an SiP utilizing a three-dimensional packaging technology for stacking a plurality of semiconductor chips, has attracting attention in recent years. In the present application, a package that includes a plurality of semiconductor chips (hereinafter, also simply referred to as chips) stacked is called a layered chip package. Since the layered chip package allows a reduction in wiring length, it provides the advantage of allowing quick circuit operation and a reduced stray capacitance of the wiring, as well as the advantage of allowing higher integration.

Major examples of the three-dimensional packaging technology for fabricating a layered chip package include a wire bonding method and a through electrode method. The wire bonding method stacks a plurality of chips on a substrate and connects a plurality of electrodes formed on each chip to external connecting terminals formed on the substrate by wire bonding. The through electrode method forms a plurality of through electrodes in each of chips to be stacked and wires the chips together by using the through electrodes.

The wire bonding method has the problem that it is difficult to reduce the distance between the electrodes so as to avoid contact between the wires, and the problem that the high resistances of the wires hamper quick circuit operation. The through electrode method is free from the above-mentioned problems of the wire bonding method.

U.S. Pat. No. 5,953,588 discloses a method of manufacturing a layered chip package as described below. In the method, a plurality of chips cut out from a processed wafer are embedded into an embedding resin and then a plurality of leads are formed to be connected to each chip, whereby a structure called a neo-wafer is fabricated. Next, the neo-wafer is diced into a plurality of structures each called a neo-chip. Each neo-chip includes one or more chips, resin surrounding the chip(s), and a plurality of leads. The plurality of leads connected to each chip have their respective end faces exposed in a side surface of the neo-chip. Next, a plurality of types of neo-chips are laminated into a stack. In the stack, the respective end faces of the plurality of leads connected to the chips of each layer are exposed in the same side surface of the stack.

Keith D. Gann, "Neo-Stacking Technology", HDI Magazine, December 1999, discloses fabricating a stack by the same method as that disclosed in U.S. Pat. No. 5,953,588, and forming wiring on two side surfaces of the stack.

U.S. Pat. No. 7,127,807 B2 discloses a multilayer module formed by stacking a plurality of active layers each including a flexible polymer substrate with at least one electronic element and a plurality of electrically-conductive traces formed within the substrate. U.S. Pat. No. 7,127,807 B2 further discloses a manufacturing method for a multilayer module as described below. In the manufacturing method, a module array stack is fabricated by stacking a plurality of module arrays each of which includes a plurality of multilayer modules arranged in two orthogonal directions. The module array stack is then cut into a module stack which is a stack of a plurality of multilayer modules. Next, a plurality of electrically-conductive lines are formed on the respective side surfaces of the plurality of multilayer modules included in the module stack. The module stack is then separated from each other into individual multilayer modules.

The yield of chips from a wafer that is to be cut later into a plurality of chips, i.e., the ratio of the number of conforming chips to the total number of chips in the wafer, is generally 90% to 99%. A layered chip package includes a plurality of chips. Therefore, the possibility that all the chips included in a layered chip package are conforming is lower than the yield of the chips. As the number of chips included in a layered chip package increases, the possibility that all the chips included in the layered chip package are conforming decreases.

A case will now be considered where a memory device such as a flash memory is constructed using a layered chip package. Generally, in a memory device such as a flash memory, a redundancy technique to replace a defective column of memory cells with a redundant column of memory cells is used so that the memory device can operate normally even when some memory cells are defective. Also in a memory device constructed using a layered chip package, if some of a plurality of memory cells included in a chip are defective, the redundancy technique can be used to allow the memory device to operate normally while allowing the use of the chip including the defective memory cells. Suppose, however, that a chip including a control circuit and a plurality of memory cells becomes defective due to, for example, a wiring failure in the control circuit, and even the redundancy technique cannot allow the chip to operate normally. In such a case, the defective chip is no longer usable. One possible solution to this case is to replace the defective chip with a conforming chip. However, this increases the manufacturing cost of the layered chip package.

Another possible solution is that a plurality of layered chip packages each including no defective chips are electrically connected to each other to construct a memory device including a desired number of chips. In this case, however, there is a problem that the wiring for electrically connecting the plurality of layered chip packages to each other becomes complicated.

U.S. Pat. No. 7,745,259 B2 discloses a layered chip package having a configuration as described below. The layered chip package includes: a main body including a plurality of layer portions; wiring disposed on a side surface of the main body; a plurality of first terminals disposed on a top surface of the main body; and a plurality of second terminals disposed on a bottom surface of the main body. Each of the plurality of layer portions includes a semiconductor chip, and a plurality of electrodes connected to the semiconductor chip. The wiring is connected to the plurality of electrodes, the plurality of first terminals, and the plurality of second terminals of the plurality of layer portions. A plurality of such layered chip packages can be stacked on each other and electrically connected to each other.

In the layered chip package disclosed in U.S. Pat. No. 7,745,259 B2, however, the plurality of first terminals and the plurality of second terminals are provided separately from the plurality of electrodes in each layer portion. This is one factor that increases the cost of the layered chip package.

OBJECT AND SUMMARY OF THE INVENTION

It is an object of the present invention to provide a plurality of layered chip packages at low cost, the plurality of layered chip packages being able to be stacked on each other and electrically connected to each other, and to provide a method of manufacturing the layered chip packages.

A layered chip package of the present invention includes a main body and wiring. The main body includes: a main part having a top surface and a bottom surface and including three or more layer portions stacked on one another; a plurality of first terminals disposed on the top surface of the main part; and a plurality of second terminals disposed on the bottom surface of the main part. The wiring includes a plurality of lines that are electrically connected to the plurality of first terminals and the plurality of second terminals and that pass through all the three or more layer portions. Each of the three or more layer portions includes a semiconductor chip and a plurality of electrodes. The semiconductor chip has a first surface, and a second surface opposite to the first surface. The plurality of electrodes are electrically connected to the wiring. In at least one of the three or more layer portions, the plurality of electrodes are electrically connected to the semiconductor chip. The plurality of electrodes are disposed on a side of the first surface of the semiconductor chip. The three or more layer portions include a first layer portion that is located closest to the top surface of the main part, and a second layer portion that is located closest to the bottom surface of the main part. The first layer portion and the second layer portion are arranged so that the second surfaces of their respective semiconductor chips face toward each other. The plurality of first terminals are formed by using the plurality of electrodes of the first layer portion. The plurality of second terminals are formed by using the plurality of electrodes of the second layer portion.

In the layered chip package of the present invention, the plurality of electrodes may be arranged in the same layout in the three or more layer portions. In this case, the plurality of electrodes may include a plurality of first terminal component parts that are used to form the plurality of first terminals in the first layer portion, and a plurality of second terminal component parts that are used to form the plurality of second terminals in the second layer portion. The plurality of electrodes may further include one or more connection parts for electrically connecting one of the first terminal component parts to one of the second terminal component parts.

In the layered chip package of the present invention, the plurality of electrodes may include a plurality of chip connection electrodes for electrical connection to the semiconductor chip. In at least one of the three or more layer portions, the plurality of chip connection electrodes may be in contact with and electrically connected to the semiconductor chip.

In the layered chip package of the present invention, the plurality of electrodes may include one or more electrodes that are not used to form any of the plurality of first terminals and the plurality of second terminals.

In the layered chip package of the present invention, the plurality of lines may include a plurality of common lines that are used for a purpose common to all the layer portions in the main part, and a plurality of layer-dependent lines that are used by different ones of the layer portions. The plurality of electrodes may include a plurality of common electrodes that are electrically connected to the plurality of common lines, and a selective connection electrode that is selectively electrically connected to only one of the plurality of layer-dependent lines that is used by the layer portion to which the selective connection electrode belongs. In at least one of the three or more layer portions, the plurality of common electrodes and the selective connection electrode may be electrically connected to the semiconductor chip, whereby the semiconductor chip may be electrically connected to the plurality of common lines and the one of the layer-dependent lines.

In the layered chip package of the present invention, the semiconductor chip may include a plurality of memory cells.

A manufacturing method of the present invention is a method of manufacturing a plurality of layered chip packages of the present invention. The manufacturing method includes the steps of fabricating a layered substructure by stacking three or more substructures each of which includes a plurality of preliminary layer portions that are arrayed, each of the preliminary layer portions being intended to become any one of the three or more layer portions, the three or more substructures being intended to be cut later at positions of boundaries between every adjacent ones of the preliminary layer portions; and producing the plurality of layered chip packages from the layered substructure. Each of the three or more substructures has a first surface and a second surface that correspond to the first surface and the second surface of the semiconductor chip, respectively. In the step of fabricating the layered substructure, the layered substructure is fabricated such that the respective second surfaces of two of the three or more substructures face toward each other, the two of the three or more substructures being located at opposite ends in a stacking direction of the three or more substructures.

According to the layered chip package or the method of manufacturing the same of the present invention, the plurality of first terminals and the plurality of second terminals can be used to stack and electrically connect a plurality of the layered chip packages. In the present invention, the first layer portion and the second layer portion are arranged so that the respective second surfaces face toward each other. The plurality of first terminals are formed by using the plurality of electrodes of the first layer portion, and the plurality of second terminals are formed by using the plurality of electrodes of the second layer portion. The present invention thus allows the plurality of first terminals and the plurality of second terminals to be formed easily. Consequently, according to the present invention, a plurality of layered chip packages that are able to be stacked on each other and electrically connected to each other are provided at low cost.

Other and further objects, features and advantages of the present invention will appear more fully from the following description.

DETAILED DESCRIPTION OF THE PREFERRED EMBODIMENTS

First Embodiment

Figure 1:
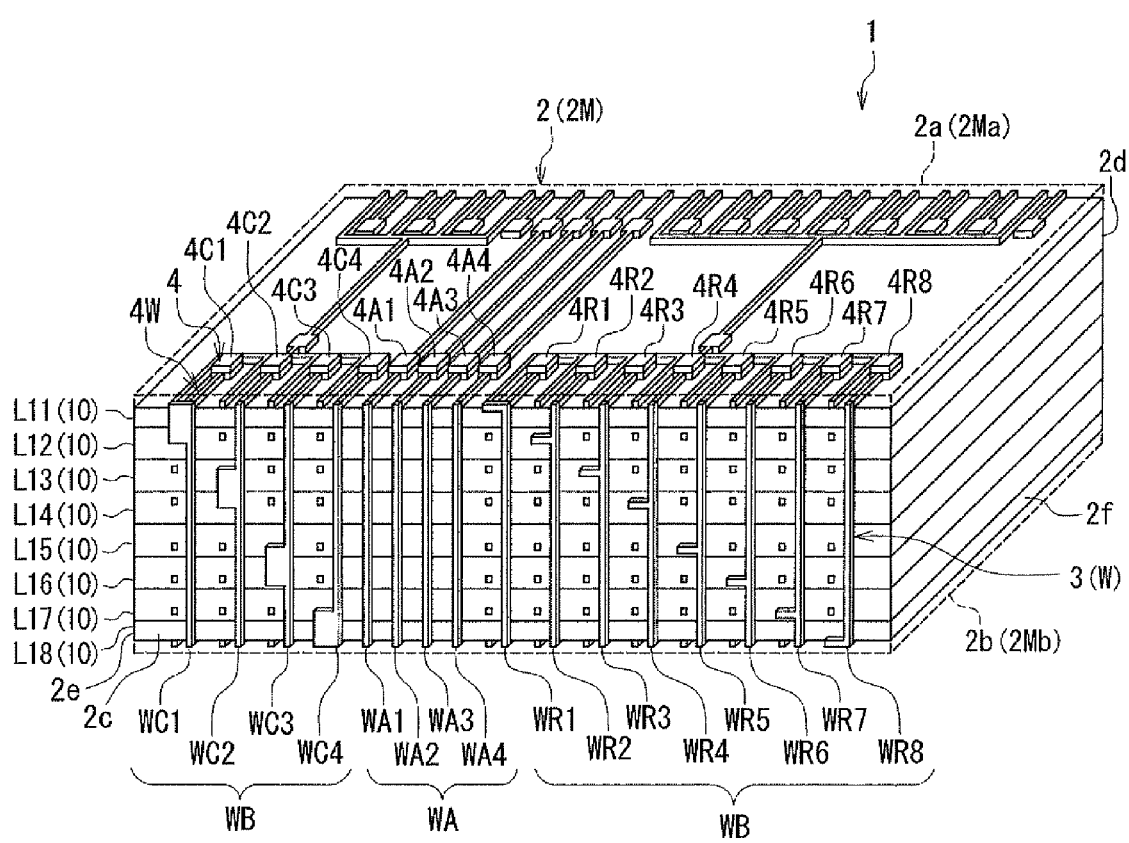
FIG. 1 is a perspective view of a layered chip package according to a first embodiment of the invention.
Figure 2:
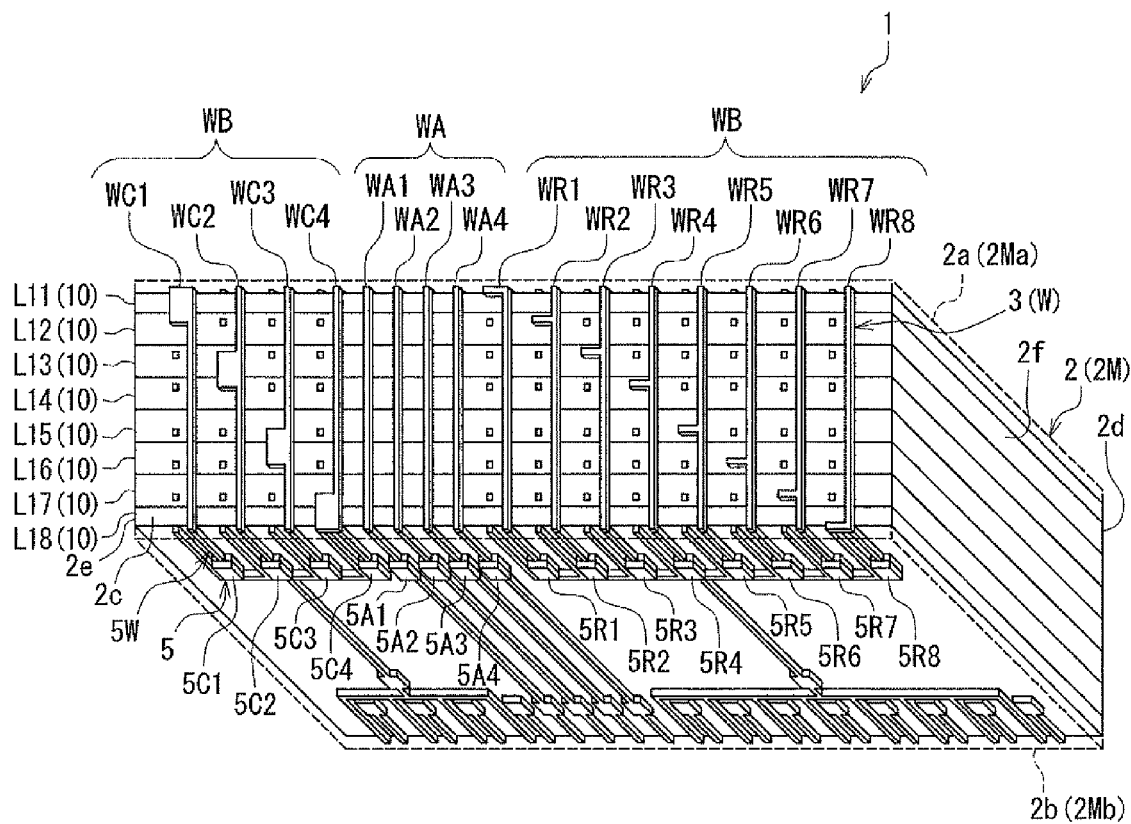
FIG. 2 is a perspective view showing the layered chip package of FIG. 1 as viewed from below.
Figure 3:
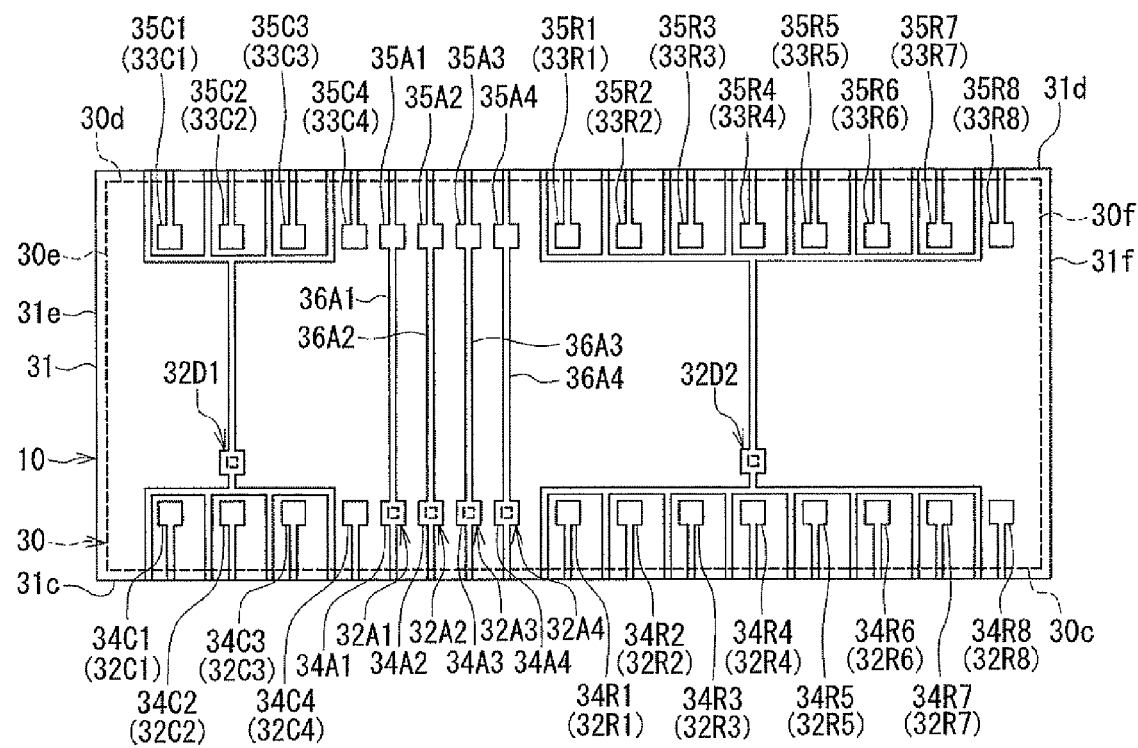
FIG. 3 is a plan view showing a layer portion included in the layered chip package shown in FIG. 1.
Figure 4:
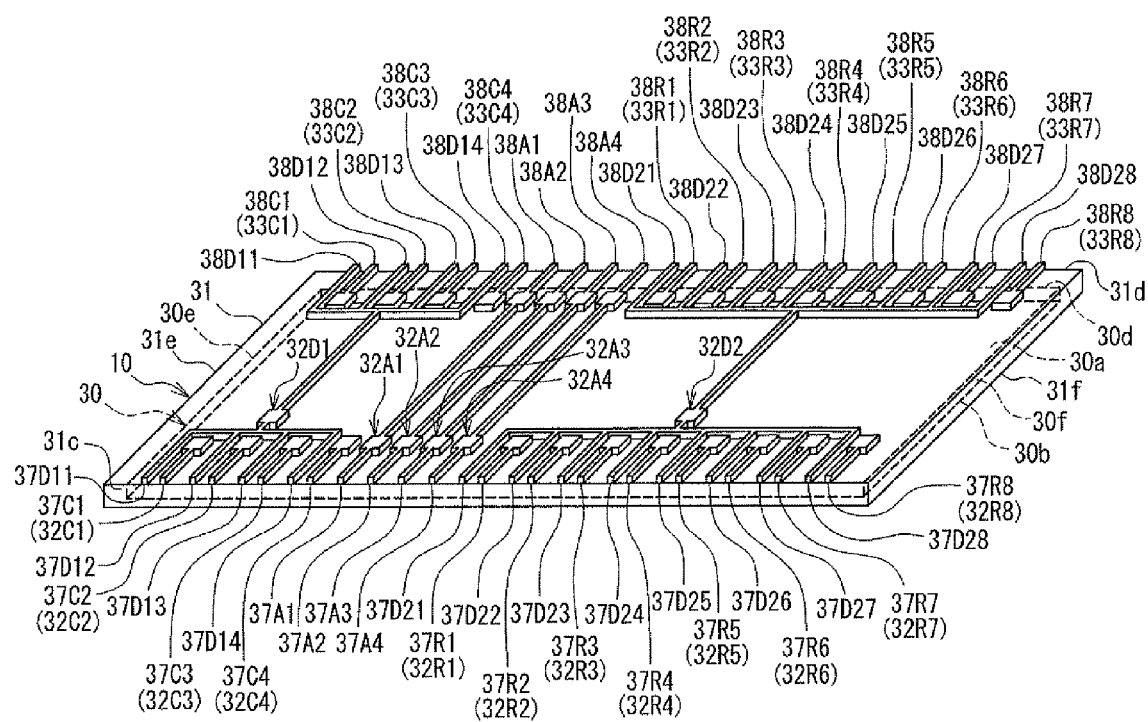
FIG. 4 is a perspective view of the layer portion shown in FIG. 3.
Figure 5:
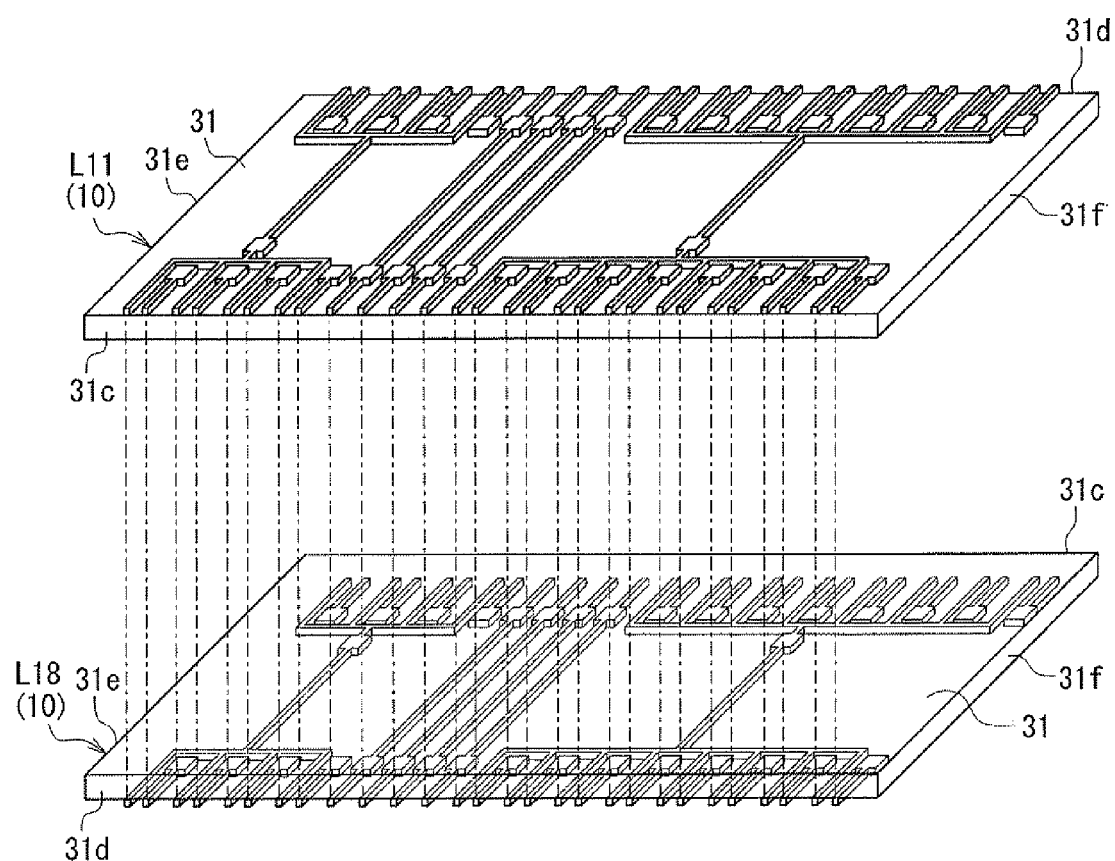
FIG. 5 is a perspective view of first and second layer portions included in the layered chip package shown in FIG. 1.

Preferred embodiments of the present invention will now be described in detail with reference to the drawings. First, reference is made to FIG. 1 to FIG. 5 to describe the configuration of a layered chip package according to a first embodiment of the invention. FIG. 1 is a perspective view of the layered chip package according to the present embodiment. FIG. 2 is a perspective view showing the layered chip package of FIG. 1 as viewed from below. FIG. 3 is a plan view showing a layer portion included in the layered chip package of FIG. 1. FIG. 4 is a perspective view of the layer portion shown in FIG. 3. FIG. 5 is a perspective view of first and second layer portions included in the layered chip package shown in FIG. 1.

As shown in FIG. 1 and FIG. 2, the layered chip package 1 according to the present embodiment includes a main body 2 and wiring 3. The wiring 3 includes a plurality of wires W disposed on at least one of side surfaces of the main body 2. The main body 2 has a top surface 2a, a bottom surface 2b, and first to fourth side surfaces 2c, 2d, 2e, and 2f. The side surfaces 2c and 2d are mutually opposite to each other. The side surfaces 2e and 2f are mutually opposite to each other. In the example shown in FIG. 1 and FIG. 2, the plurality of wires W are disposed on the first side surface 2c only. The main body 2 includes a main part 2M. The main part 2M has a top surface 2Ma and a bottom surface 2Mb, and includes a plurality of layer portions 10 stacked on one another. The plurality of wires W pass through all the plurality of layer portions 10. The plurality of wires W correspond to the plurality of lines of the present invention.

The main body 2 further includes a plurality of first terminals 4 and a plurality of second terminals 5. The plurality of first terminals 4 are disposed on the top surface 2Ma of the main part 2M and electrically connected to the plurality of wires W. The plurality of second terminals 5 are disposed on the bottom surface 2Mb of the main part 2M and electrically connected to the plurality of wires W. The main body 2 further includes top wiring 4W and bottom wiring 5W. The top wiring 4W is disposed on the top surface 2Ma of the main part 2M and electrically connects the plurality of first terminals 4 to the plurality of wires W. The bottom wiring 5W is disposed on the bottom surface 2Mb of the main part 2M and electrically connects the plurality of second terminals 5 to the plurality of wires W.

The present embodiment allows a plurality of layered chip packages 1 to be stacked on each other and electrically connected to each other. The plurality of second terminals 5 are positioned to overlap the plurality of first terminals 4 as viewed in a direction perpendicular to the top surface 2a of the main body 2. When a plurality of layered chip packages 1 are stacked on each other, the plurality of second terminals 5 of the upper one of any two vertically adjacent layered chip packages 1 are therefore opposed to the plurality of first terminals 4 of the lower one. When a plurality of layered chip packages 1 are stacked on each other, the plurality of second terminals 5 of the upper one of any two vertically adjacent layered chip packages 1 are electrically connected to the plurality of first terminals 4 of the lower one.

At least either the terminals 4 or the terminals 5 may each include a solder layer made of a solder material, the solder layer being exposed in the surface of each of the terminals 4 or each of the terminals 5. In such a case, the solder layer is heated to melt and then solidified, whereby the plurality of second terminals 5 of the upper one of two vertically adjacent layered chip packages 1 are electrically connected to the plurality of first terminals 4 of the lower one.

The plurality of layer portions 10 are stacked between the top surface 2Ma and the bottom surface 2Mb of the main part 2M. Every two vertically adjacent layer portions 10 are bonded to each other with an insulating adhesive, for example. As one example, FIG. 1 and FIG. 2 show a case where the main part 2M includes eight layer portions 10. However, the number of the layer portions 10 to be included in the main part 2M is not limited to eight, and may be any number not smaller than three. Hereinafter, the eight layer portions 10 of the main part 2M shown in FIG. 1 and FIG. 2 will be designated by reference symbols L11, L12, L13, L14, L15, L16, L17, and L18 in order from the top when the eight layer portions 10 are to be shown distinctively.

A description will now be given of the layer portions 10 with reference to FIG. 3 and FIG. 4. Each of the layer portions 10 includes a semiconductor chip 30. The semiconductor chip 30 has: a first surface 30a with a device formed thereon; a second surface 30b opposite to the first surface 30a; a first side surface 30c and a second side surface 30d that are mutually opposite to each other; and a third side surface 30e and a fourth side surface 30f that are mutually opposite to each other.

Each of the layer portions 10 further includes an insulating portion 31 and a plurality of electrodes. The insulating portion 31 covers at least one of the four side surfaces of the semiconductor chip 30. The insulating portion 31 has at least one end face that is located in the at least one of the side surfaces of the main body 2 on which the plurality of wires W are disposed. In the example shown in FIG. 3 and FIG. 4, the insulating portion 31 covers all of the four side surfaces 30c, 30d, 30e and 30f of the semiconductor chip 30, and has four end faces 31c, 31d, 31e and 31f located in the four side surfaces of the main body 2. The four end faces 31c, 31d, 31e, and 31f of the insulating portion 31 lie outside the four side surfaces 30c, 30d, 30e, and 30f of the semiconductor chip 30, respectively. The plurality of electrodes are disposed on the side of the first surface 30a of the semiconductor chip 30.

The plurality of layer portions 10 include a first layer portion that is located closest to the top surface 2Ma of the main part 2M, and a second layer portion that is located closest to the bottom surface 2Mb of the main part 2M. The first layer portion and the second layer portion are arranged so that the second surfaces 30b of their respective semiconductor chips 30 face toward each other. This structure will now be described with reference to FIG. 5. FIG. 5 is a perspective view of the first and second layer portions included in the layered chip package 1 shown in FIG. 1 and FIG. 2. The layer portion L11 corresponds to the first layer portion according to the present invention. The layer portion L18 corresponds to the second layer portion according to the present invention.

In the present embodiment, the layer portions L11 to L18 have the same configuration in appearance except for their insulating portions 31, and the plurality of electrodes are arranged in the same layout in the layer portions L11 to L18. These are as shown in FIG. 3 and FIG. 4. However, the layer portion L11 and the layer portion L18 are arranged in different orientations in the main part 2M. More specifically, the layer portion L11 is arranged with the first surface 30a of the semiconductor chip 30 upward and the side surfaces 30c, 30d, 30e, and 30f of the semiconductor chip 30 toward the side surfaces 2c, 2d, 2e, and 2f of the main body 2, respectively. The layer portion L18 is arranged with the first surface 30a of the semiconductor chip 30 downward and the side surfaces 30d, 30c, 30e, and 30f of the semiconductor chip 30 toward the side surfaces 2c, 2d, 2e, and 2f of the main body 2, respectively. The layer portions L11 and L18 are thus arranged so that the respective second surfaces 30b face toward each other. In FIG. 5, the orientations of the layer portions L11 and L18 are shown using the end faces 31c, 31d, 31e, and 31f of the respective insulating portions 31 instead of the side surfaces 30c, 30d, 30e, and 30f of the respective semiconductor chips 30.

The layer portions L12 to L14 in the main part 2M are arranged in the same orientation as that of the layer portion L11 shown in FIG. 5. The layer portions L15 to L17 in the main part 2M are arranged in the same orientation as that of the layer portion L18 shown in FIG. 5.

A detailed description will now be given of the plurality of terminals 4 and 5, the plurality of wires W, and the plurality of electrodes of the present embodiment. In the present embodiment, the plurality of second terminals 5 are electrically connected to corresponding ones of the first terminals 4 via the wires W to form a plurality of pairs of first and second terminals 4 and 5. In each of the plurality of pairs of first and second terminals 4 and 5, the first and second terminals 4 and 5 are electrically connected to each other. Each of the plurality of pairs of first and second terminals 4 and 5 consists of any one of the first terminals 4 and any one of the second terminals 5 that are electrically connected to each other and are positioned to overlap each other as viewed in the direction perpendicular to the top surface 2a of the main body 2.

In the example shown in FIG. 1 and FIG. 2, the plurality of first terminals 4 include first-type terminals 4A1, 4A2, 4A3, and 4A4, second-type terminals 4C1, 4C2, 4C3, and 4C4, and third-type terminals 4R1, 4R2, 4R3, 4R4, 4R5, 4R6, 4R7, and 4R8. Likewise, the plurality of second terminals 5 include first-type terminals 5A1, 5A2, 5A3, and 5A4, second-type terminals 5C1, 5C2, 5C3, and 5C4, and third-type terminals 5R1, 5R2, 5R3, 5R4, 5R5, 5R6, 5R7, and 5R8. The terminals 5A1 to 5A4 are paired with the terminals 4A1 to 4A4, respectively. The terminals 5C1 to 5C4 are paired with the terminals 4C1 to 4C4, respectively. The terminals 5R1 to 5R8 are paired with the terminals 4R1 to 4R8, respectively.

The plurality of wires W include a plurality of common wires WA that are used for a purpose common to all the layer portions 10 in the main part 2M, and a plurality of layer-dependent wires WB that are used by different ones of the plurality of layer portions 10. The plurality of common wires WA include wires WA1, WA2, WA3, and WA4. The plurality of layer-dependent wires WB include wires WC1, WC2, WC3, WC4, WR1, WR2, WR3, WR4, WR5, WR6, WR7, and WR8. The wires WA1, WA2, WA3, and WA4 electrically connect the first and second terminals 4 and 5 in the pairs of terminals (4A1, 5A1), (4A2, 5A2), (4A3, 5A3), and 4A4, 5A4), respectively.

The wires WC1, WC2, WC3, and WC4 electrically connect the first and second terminals 4 and 5 in the pairs of terminals (4C1, 5C1), (4C2, 5C2), (4C3, 5C3), and (4C4, 5C4), respectively. The wire WC1 is used by the layer portions L11 and L12. The wire WC2 is used by the layer portions L13 and L14. The wire WC3 is used by the layer portions L15 and L16. The wire WC4 is used by the layer portions L17 and L18.

The wires WR1, WR2, WR3, WR4, WR5, WR6, WR7, and WR8 electrically connect the first and second terminals 4 and 5 in the pairs of terminals (4R1, 5R1), (4R2, 5R2), (4R3, 5R3), (4R4, 5R4), (4R5, 5R5), (4R6, 5R6), (4R7, 5R7), and (4R8, 5R8), respectively. The wires WR1 to WR8 are used by the layer portions L11 to L18, respectively.

The wires WC1 to WC4 and WR1 to WR8 are used for electrical connection to the semiconductor chip 30 of at least one of the plurality of layer portions 10 in the main part 2M.

As will be described in detail later, the plurality of first terminals 4 are formed by using the plurality of electrodes of the layer portion L11 (the first layer portion) which is located closest to the top surface 2Ma of the main part 2M, and the plurality of second terminals 5 are formed by using the plurality of electrodes of the layer portion L18 (the second layer portion) which is located closest to the bottom surface 2Mb of the main part 2M. The plurality of electrodes include a plurality of first terminal component parts that are used to form the plurality of first terminals 4 in the layer portion L11, and a plurality of second terminal component parts that are used to form the plurality of second terminals 5 in the layer portion L18. As shown in FIG. 3 and FIG. 4, the plurality of electrodes include the following first- to sixth-type electrodes.

The first-type electrodes 32A1, 32A2, 32A3, and 32A4 extend in a direction parallel to the side surfaces 30e and 30f of the semiconductor chip 30 and the end faces 31e and 32f of the insulating portion 31. The electrode 32A1 includes a first terminal component part 34A1 that is used to form the terminal 4A1 in the layer portion L11, a second terminal component part 35A1 that is used to form the terminal 5A1 in the layer portion L18, and a connection part 36A1 that electrically connects the terminal component parts 34A1 and 35A1 to each other.

The electrode 32A2 includes a first terminal component part 34A2 that is used to form the terminal 4A2 in the layer portion L11, a second terminal component part 35A2 that is used to form the terminal 5A2 in the layer portion L18, and a connection part 36A2 that electrically connects the terminal component parts 34A2 and 35A2 to each other.

The electrode 32A3 includes a first terminal component part 34A3 that is used to form the terminal 4A3 in the layer portion L11, a second terminal component part 35A3 that is used to form the terminal 5A3 in the layer portion L18, and a connection part 36A3 that electrically connects the terminal component parts 34A3 and 35A3 to each other.

The electrode 32A4 includes a first terminal component part 34A4 that is used to form the terminal 4A4 in the layer portion L11, a second terminal component part 35A4 that is used to form the terminal 5A4 in the layer portion L18, and a connection part 36A4 that electrically connects the terminal component parts 34A4 and 35A4 to each other.

The electrodes 32A1, 32A2, 32A3, and 32A4 have first connection parts 37A1, 37A2, 37A3, and 37A4, respectively, and second connection parts 38A1, 38A2, 38A3, and 38A4, respectively. The first connection parts 37A1 to 37A4 are formed of respective end faces of the electrodes 32A1 to 32A4 that are located in the end face 31c of the insulating portion 31. The second connection parts 38A1 to 38A4 are formed of respective end faces of the electrodes 32A1 to 32A4 that are located in the end face 31d of the insulating portion 31. In the layer portions L11 to L14, the first connection parts 37A1 to 37A4 are located in the first side surface 2c of the main body 2 and are in contact with the wires WA1 to WA4, respectively. On the other hand, in the layer portions L15 to L18, the second connection parts 38A1 to 38A4 are located in the first side surface 2c of the main body 2 and are in contact with the wires WA1 to WA4, respectively. The electrodes 32A1 to 32A4 of the plurality of layer portions 10 are thus electrically connected to the wires WA1 to WA4, respectively. In at least one of the plurality of layer portions 10, the first-type electrodes 32A1 to 32A4 are in contact with and electrically connected to the semiconductor chip 30. In FIG. 3, the dashed squares in the electrodes 32A1 to 32A4 represent the areas where the electrodes 32A1 to 32A4 make contact with the semiconductor chip 30. The first-type electrodes 32A1 to 32A4 correspond to the plurality of common electrodes of the present invention.

The second-type electrodes 32C1, 32C2, 32C3, and 32C4 respectively have first terminal component parts 34C1, 34C2, 34C3, and 34C4 that are used to form the terminals 4C1, 4C2, 4C3, and 4C4 in the layer portion L11, respectively. The electrodes 32C1, 32C2, 32C3, and 32C4 further have first connection parts 37C1, 37C2, 37C3, and 37C4, respectively. The first connection parts 37C1 to 37C4 are formed of respective end faces of the electrodes 32C1 to 32C4 that are located in the end face 31c of the insulating portion 31. In the layer portions L11 to L14, the first connection parts 37C1 to 37C4 are located in the first side surface 2c of the main body 2 and are in contact with the wires WC1 to WC4, respectively. The electrodes 32C1 to 32C4 of the layer portions L11 to L14 are thus electrically connected to the wires WC1 to WC4, respectively. On the other hand, in the layer portions L15 to L18, the first connection parts 37C1 to 37C4 are located in the second side surface 2d of the main body 2 and are in contact with none of the wires. Consequently, the electrodes 32C1 to 32C4 of the layer portions L15 to L18 are electrically connected to none of the wires. The second-type electrodes are not in contact with the semiconductor chip 30.

The third-type electrodes 32R1, 32R2, 32R3, 32R4, 32R5, 32R6, 32R7, and 32R8 respectively have first terminal component parts 34R1, 34R2, 34R3, 34R4, 34R5, 34R6, 34R7, and 34R8 that are used to form the terminals 4R1, 4R2, 4R3, 4R4, 4R5, 4R6, 4R7, and 4R8 in the layer portion L11, respectively. The electrodes 32R1, 32R2, 32R3, 32R4, 32R5, 32R6, 32R7, and 32R8 further have first connection parts 37R1, 37R2, 37R3, 37R4, 37R5, 37R6, 37R7, and 37R8, respectively. The first connection parts 37R1 to 37R8 are formed of respective end faces of the electrodes 32R1 to 32R8 that are located in the end face 31c of the insulating portion 31. In the layer portions L11 to L14, the first connection parts 37R1 to 37R8 are located in the first side surface 2c of the main body 2 and are in contact with the wires WR1 to WR8, respectively. The electrodes 32R1 to 32R8 of the layer portions L11 to L14 are thus electrically connected to the wires WR1 to WR8, respectively. On the other hand, in the layer portions L15 to L18, the first connection parts 37R1 to 37R8 are located in the second side surface 2d of the main body 2 and are in contact with none of the wires. Consequently, the electrodes 32R1 to 32R8 of the layer portions L15 to L18 are electrically connected to none of the wires. The third-type electrodes are not in contact with the semiconductor chip 30.

The fourth-type electrodes 33C1, 33C2, 33C3, and 33C4 respectively have second terminal component parts 35C1, 35C2, 35C3, and 35C4 that are used to form the terminals 5C1, 5C2, 5C3, and 5C4 in the layer portion L18, respectively. The electrodes 33C1, 33C2, 33C3, and 33C4 further have second connection parts 38C1, 38C2, 38C3, and 38C4, respectively. The second connection parts 38C1 to 38C4 are formed of respective end faces of the electrodes 33C1 to 33C4 that are located in the end face 31d of the insulating portion 31. In the layer portions L15 to L18, the second connection parts 38C1 to 38C4 are located in the first side surface 2c of the main body 2 and are in contact with the wires WC1 to WC4, respectively. The electrodes 33C1 to 33C4 of the layer portions L15 to L18 are thus electrically connected to the wires WC1 to WC4, respectively. On the other hand, in the layer portions L11 to L14, the second connection parts 38C1 to 38C4 are located in the second side surface 2d of the main body 2 and are in contact with none of the wires. Consequently, the electrodes 33C1 to 33C4 of the layer portions L11 to L14 are electrically connected to none of the wires. The fourth-type electrodes are not in contact with the semiconductor chip 30.

The fifth-type electrodes 33R1, 33R2, 33R3, 33R4, 33R5, 33R6, 33R7, and 33R8 respectively have second terminal component parts 35R1, 35R2, 35R3, 35R4, 35R5, 35R6, 35R7, and 35R8 that are used to form the terminals 5R1, 5R2, 5R3, 5R4, 5R5, 5R6, 5R7, and 5R8 in the layer portion L18, respectively. The electrodes 33R1, 33R2, 33R3, 33R4, 33R5, 33R6, 33R7, and 33R8 further have second connection parts 38R1, 38R2, 38R3, 38R4, 38R5, 38R6, 38R7, and 38R8, respectively. The second connection parts 38R1 to 38R8 are formed of respective end faces of the electrodes 33R1 to 33R8 that are located in the end face 31d of the insulating portion 31. In the layer portions L15 to L18, the second connection parts 38R1 to 38R8 are located in the first side surface 2c of the main body 2 and are in contact with the wires WR1 to WR8, respectively. The electrodes 33R1 to 33R8 of the layer portions L15 to L18 are thus electrically connected to the wires WR1 to WR8, respectively. On the other hand, in the layer portions L11 to L14, the second connection parts 38R1 to 38R8 are located in the second side surface 2d of the main body 2 and are in contact with none of the wires. Consequently, the electrodes 33R1 to 33R8 of the layer portions L11 to L14 are electrically connected to none of the wires. The fifth-type electrodes are not in contact with the semiconductor chip 30.

The sixth-type electrodes 32D1 and 32D2 are not used to form the terminals 4 or 5. The electrode 32D1 has first to eighth branch portions. The first to fourth branch portions of the electrode 32D1 have first connection parts 37D11, 37D12, 37D13, and 37D14, respectively. The fifth to eighth branch portions of the electrode 32D1 have second connection parts 38D11, 38D12, 38D13, and 38D14, respectively. The first connection parts 37D11 to 37D14 are formed of respective end faces of the first to fourth branch portions of the electrode 32D1 that are located in the end face 31c of the insulating portion 31. The second connection parts 38D11 to 38D14 are formed of respective end faces of the fifth to eighth branch portions of the electrode 32D1 that are located in the end face 31d of the insulating portion 31. The first connection parts 37D11 to 37D14 are located near the connection parts 37C1 to 37C4 of the electrodes 32C1 to 32C4, respectively. The second connection parts 38D11 to 38D14 are located near the connection parts 38C1 to 38C4 of the electrodes 33C1 to 33C4, respectively.

The electrode 32D2 has first to sixteenth branch portions. The first to eighth branch portions of the electrode 32D2 have first connection parts 37D21, 37D22, 37D23, 37D24, 37D25, 37D26, 37D27, and 37D28, respectively. The ninth to sixteenth branch portions of the electrode 32D2 have second connection parts 38D21, 38D22, 38D23, 38D24, 38D25, 38D26, 38D27, and 38D28, respectively. The first connection parts 37D21 to 37D28 are formed of respective end faces of the first to eighth branch portions of the electrode 32D2 that are located in the end face 31c of the insulating portion 31. The second connection parts 38D21 to 38D28 are formed of respective end faces of the ninth to sixteenth branch portions of the electrode 32D2 that are located in the end face 31d of the insulating portion 31. The first connection parts 37D21 to 37D28 are located near the connection parts 37R1 to 37R8 of the electrodes 32R1 to 32R8, respectively. The second connection parts 38D21 to 38D28 are located near the connection parts 38R1 to 38R8 of the electrodes 33R1 to 33R8, respectively.

In the layer portions L11 to L14, the first connection parts 37D11 to 37D14 and 37D21 to 37D28 are located in the first side surface 2c of the main body 2. On the other hand, in the layer portions L15 to L18, the second connection parts 38D11 to 38D14 and 38D21 to 38D28 are located in the first side surface 2c of the main body 2.

In at least one of the plurality of layer portions 10, the sixth-type electrodes 32D1 and 32D2 are in contact with and electrically connected to the semiconductor chip 30. In FIG. 3, the dashed squares in the electrodes 32D1 and 32D2 represent the areas where the electrodes 32D1 and 32D2 make contact with the semiconductor chip 30.

The first-type electrodes 32A1 to 32A4 and the sixth-type electrodes 32D1 and 32D2 are used for electrical connection to the semiconductor chip 30, and thus correspond to the chip connection electrodes according to the present invention.

The sixth-type electrodes 32D1 and 32D2 are electrodes with which different signals are associated from one layer portion 10 (one of layer portions L11 to L18) to another. Each of the sixth-type electrodes 32D1 and 32D2 corresponds to the selective connection electrode according to the present invention. As described below, the sixth-type electrodes 32D1 and 32D2 in each layer portion 10 are selectively electrically connected to one of the wires WC1 to WC4 and one of the wires WR1 and WR8, respectively, that the layer portion 10 uses.

The wire WC1 is broadened in part and thereby comes in contact with the first connection part 37D11 in each of the layer portions L11 and L12. The electrodes 32D1 of the layer portions L11 and L12 are thereby electrically connected to the wire WC1.

The wire WC2 is broadened in part and thereby comes in contact with the first connection part 37D12 in each of the layer portions L13 and L14. The electrodes 32D1 of the layer portions L13 and L14 are thereby electrically connected to the wire WC2.

The wire WC3 is broadened in part and thereby comes in contact with the second connection part 38D13 in each of the layer portions L15 and L16. The electrodes 32D1 of the layer portions L15 and L16 are thereby electrically connected to the wire WC3.

The wire WC4 is broadened in part and thereby comes in contact with the second connection part 38D14 in each of the layer portions L17 and L18. The electrodes 32D1 of the layer portions L17 and L18 are thereby electrically connected to the wire WC4.

The wire WR1 is broadened in part and thereby comes in contact with the first connection part 37D21 in the layer portion L11. The electrode 32D2 of the layer portion L11 is thereby electrically connected to the wire WR1. The wire WR2 is broadened in part and thereby comes in contact with the first connection part 37D22 in the layer portion L12. The electrode 32D2 of the layer portion L12 is thereby electrically connected to the wire WR2.

The wire WR3 is broadened in part and thereby comes in contact with the first connection part 37D23 in the layer portion L13. The electrode 32D2 of the layer portion L13 is thereby electrically connected to the wire WR3. The wire WR4 is broadened in part and thereby comes in contact with the first connection part 37D24 in the layer portion L14. The electrode 32D2 of the layer portion L14 is thereby electrically connected to the wire WR4.

The wire WR5 is broadened in part and thereby comes in contact with the second connection part 38D25 in the layer portion L15. The electrode 32D2 of the layer portion L15 is thereby electrically connected to the wire WR5. The wire WR6 is broadened in part and thereby comes in contact with the second connection part 38D26 in the layer portion L16. The electrode 32D2 of the layer portion L16 is thereby electrically connected to the wire WR6.

The wire WR7 is broadened in part and thereby comes in contact with the second connection part 38D27 in the layer portion L17. The electrode 32D2 of the layer portion L17 is thereby electrically connected to the wire WR7. The wire WR8 is broadened in part and thereby comes in contact with the second connection part 38D28 in the layer portion L18.

The electrode 32D2 of the layer portion L18 is thereby electrically connected to the wire WR8.

In each of the layer portions L11 and L18, the insulating portion 31 does not cover the first and second terminal component parts of the plurality of electrodes but covers the other portions of the plurality of electrodes and the first surface 30a of the semiconductor chip 30. The first and second terminal component parts not covered by the insulating portion 31 form respective conductor pads. Conductor layers are formed on the conductor pads. The first terminal component parts and the conductor layers in the layer portion L11 constitute the first terminals 4. The second terminal component parts and the conductor layers in the layer portion L18 constitute the second terminals 5. In the present embodiment, the plurality of first terminals 4 are thus formed by using the plurality of electrodes (the plurality of first terminal component parts) of the layer portion L11. Part of the portions of the plurality of electrodes covered by the insulating portion 31 in the layer portion L11 forms the top wiring 4W. The plurality of second terminals 5 are formed by using the plurality of electrodes (the plurality of second terminal component parts) of the layer portion L18. Part of the portions of the plurality of electrodes covered by the insulating portion 31 in the layer portion L18 forms the bottom wiring 5W. In FIG. 1 and FIG. 2, the insulating portions 31 in the layer portions L11 and L18 are partly shown in broken lines.

The plurality of layer portions 10 include at least one first-type layer portion. The plurality of layer portions 10 may further include at least one second-type layer portion. The semiconductor chip 30 of the first-type layer portion is non-malfunctioning, whereas the semiconductor chip 30 of the second-type layer portion is malfunctioning. Hereinafter, a non-malfunctioning semiconductor chip 30 will be referred to as a conforming semiconductor chip 30, and a malfunctioning semiconductor chip 30 will be referred to as a defective semiconductor chip 30. Hereinafter, the first-type layer portion will be designated by reference symbol 10A and the second-type layer portion will be designated by reference symbol 10B when the first-type layer portion and the second-type layer portion are to be distinguished from each other.

In the first-type layer portion 10A, the first-type electrodes 32A1 to 32A4 are in contact with and electrically connected to the semiconductor chip 30. In the second-type layer portion 10B, none of the first-type electrodes 32A1 to 32A4 are in contact with the semiconductor chip 30. Therefore, in the second-type layer portion 10B, none of the first-type electrodes 32A1 to 32A4 are electrically connected to the semiconductor chip 30.

In the first-type layer portion 10A, the sixth-type electrodes 32D1 and 32D2 are electrically connected to the semiconductor chip 30, and the semiconductor chip 30 is thereby electrically connected to two layer-dependent wires WB to which the electrodes 32D1 and 32D2 are electrically connected, i.e., one of the wires WC1 to WC4 to which the electrode 32D1 is electrically connected and one of the wires WR1 to WR8 to which the electrode 32D2 is electrically connected. In the second-type layer portion 10B, neither of the electrodes 32D1 and 32D2 is electrically connected to the semiconductor chip 30, and the semiconductor chip 30 is therefore not electrically connected to two layer-dependent wires WB to which the electrodes 32D1 and 32D2 are electrically connected.

The semiconductor chip 30 may be a memory chip that constitutes a memory such as a flash memory, DRAM, SRAM, MRAM, PROM, or FeRAM. In such a case, the semiconductor chip 30 includes a plurality of memory cells. In such a case, it is possible to implement a memory device of large capacity by using the layered chip package 1 which includes a plurality of semiconductor chips 30. With the layered chip package 1 according to the present embodiment, it is also possible to easily implement a memory of various capacities such as 64 GB (gigabytes), 128 GB, and 256 GB, by changing the number of the semiconductor chips 30 to be included in the layered chip package 1.

Suppose that the semiconductor chip 30 includes a plurality of memory cells. In this case, even if one or more of the memory cells are defective, the semiconductor chip 30 is still conforming if it can function normally by employing the redundancy technique.

The semiconductor chips 30 are not limited to memory chips, and may be ones used for implementing other devices such as CPUs, sensors, and driving circuits for sensors.

Now, a description will be given of a composite layered chip package of the present embodiment. The composite layered chip package of the present embodiment includes a main package and an additional portion that are stacked on each other and electrically connected to each other. The layered chip package 1 according to the present embodiment serves as the main package. Hereinafter, the main package will also be designated by reference numeral 1.

The additional portion 51 includes at least one additional semiconductor chip, and additional portion wiring. The additional portion wiring defines electrical connections between the at least one additional semiconductor chip and the plurality of first terminals 4 or second terminals 5 of the layered chip package 1 so that the at least one additional semiconductor chip substitutes for the semiconductor chip 30 of the second-type layer portion 10B of the layered chip package 1.

Figure 6:
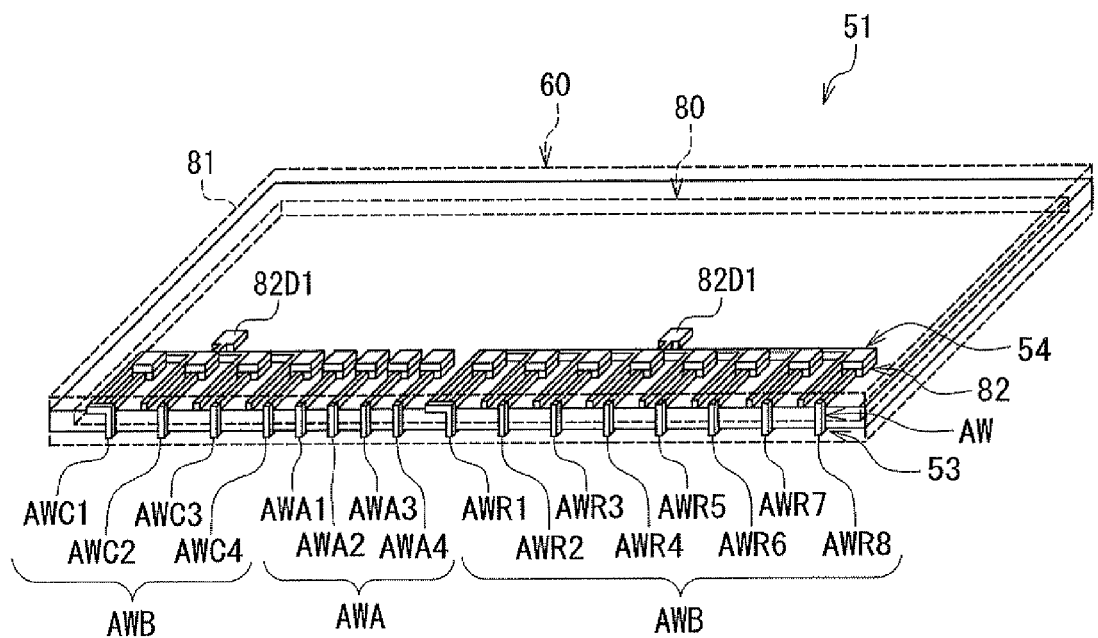
FIG. 6 is a perspective view showing an example of an additional portion in the first embodiment of the invention.
Figure 7:
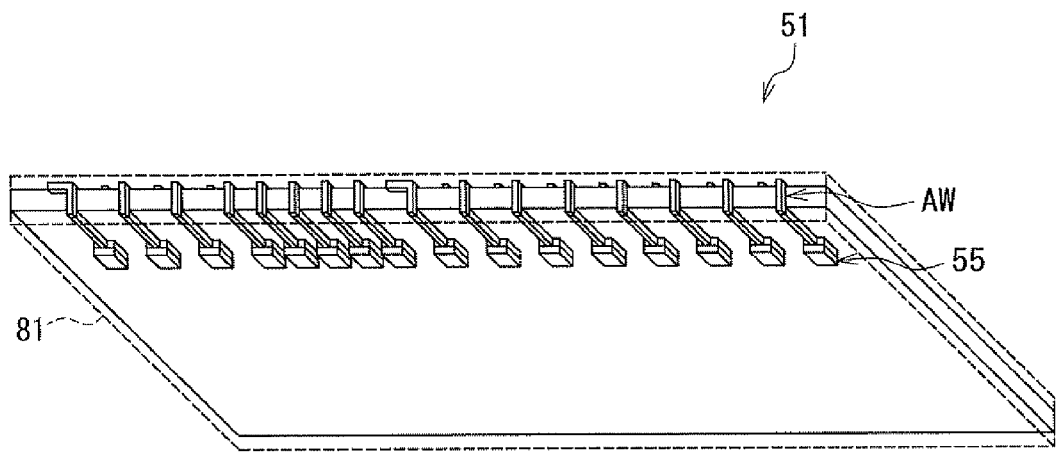
FIG. 7 is a perspective view showing the additional portion of FIG. 6 as viewed from below.

FIG. 6 is a perspective view showing an example of the additional portion 51. FIG. 7 is a perspective view showing the additional portion 51 of FIG. 6 as viewed from below. The additional portion 51 includes an additional portion main body 60 and additional portion wiring 53. The additional portion main body 60 has a top surface, a bottom surface, and four side surfaces. The additional portion main body 60 includes an additional semiconductor chip 80. The additional semiconductor chip 80 has the same configuration as that of a conforming semiconductor chip 30. The additional portion main body 60 corresponds to a single first-type layer portion 10A.

The additional portion wiring 53 includes: a plurality of additional portion wires AW that are disposed on at least one of the side surfaces of the additional portion main body 60; a plurality of first additional portion terminals 54 that are disposed on the top surface of the additional portion main body 60 and electrically connected to the plurality of additional portion wires AW; and a plurality of second additional portion terminals 55 that are disposed on the bottom surface of the additional portion main body 60 and electrically connected to the plurality of additional portion wires AW. The shape and layout of the plurality of first additional portion terminals 54 are the same as those of the plurality of first terminals 4 shown in FIG. 1. The shape and layout of the plurality of second additional portion terminals 55 are the same as those of the plurality of second terminals 5 shown in FIG. 2. The plurality of second additional portion terminals 55 are positioned to overlap the plurality of first additional portion terminals 54. The plurality of additional portion wires AW electrically connect the first additional portion terminals 54 and the second additional portion terminals 55 that are positioned to overlap each other.

The additional portion main body 60 further includes an insulating portion 81 that covers the top and bottom surfaces and at least one of the four side surfaces of the additional semiconductor chip 80, and a plurality of electrodes 82 that are electrically connected to the plurality of additional portion wires AW. The insulating portion 81 has at least one end face located in the at least one of the side surfaces of the additional portion main body 60 on which the plurality of additional portion wires AW are disposed. In the example shown in FIG. 6 and FIG. 7, the insulating portion 81 covers all of the four side surfaces of the additional semiconductor chip 80, and has four end faces located in the four side surfaces of the additional portion main body 60. The electrodes 82 have their respective end faces that are located in the at least one of the side surfaces of the additional portion main body 60 on which the plurality of additional portion wires AW are disposed. The additional portion wires AW are electrically connected to such end faces. The plurality of first additional portion terminals 54 and the plurality of second additional portion terminals 55 are exposed from the insulating portion 81. In FIG. 6 and FIG. 7, part of the insulating portion 81 is shown by broken lines.

The plurality of electrodes 82 include a plurality of electrodes corresponding to the electrodes 32A1 to 32A4, 32C1 to 32C4, and 32R1 to 32R8 among the plurality of electrodes shown in FIG. 3 and FIG. 4. Such electrodes each include a terminal component part that constitutes a first additional portion terminal 54, and a part that electrically connects the terminal component part to an additional portion wire AW. The plurality of electrodes 82 further include electrodes 82D1 and 82D2 corresponding to the electrodes 32D1 and 32D2. The plurality of first additional portion terminals 54 are formed by using the plurality of electrodes 82 except the electrodes 82D1 and 82D2. In other words, the terminal component parts of the plurality of electrodes 82 except the electrodes 82D1 and 82D2 form conductor pads. Conductor layers are formed on the conductor pads. The conductor pads and conductor layers constitute the first additional portion terminals 54. The plurality of electrodes 82 corresponding to the electrodes 32A1 to 32A4, and the electrodes 82D1 and 82D2 are in contact with and electrically connected to the additional semiconductor chip 80.

Like the plurality of wires W of the layered chip package 1, the plurality of additional portion wires AW include a plurality of common wires AWA and a plurality of layer-dependent wires AWB. The plurality of common wires AWA include wires AWA1 to AWA4 that correspond to the wires WA1 to WA4, respectively. The plurality of layer-dependent wires AWB include wires AWC1 to AWC4 and AWR1 to AWR8 that correspond to the wires WC1 to WC4 and WR1 to WR8, respectively.

In the additional portion 51 shown in FIG. 6 and FIG. 7, the wires AWC1 and AWR1 are broadened in part so that the electrode 82D1 is electrically connected to the wire AWC1 while the electrode 82D2 is electrically connected to the wire AWR1. This additional portion 51 has the same configuration and function as those of the layer portion L11. This additional portion 51 is to substitute for the layer portion L11 if the layer portion L11 is a second-type layer portion 10B.

In another additional portion 51, the wires AWC1 and AWR2 are broadened in part so that the electrode 82D1 is electrically connected to the wire AWC1 while the electrode 82D2 is electrically connected to the wire AWR2. This additional portion 51 has the same configuration and function as those of the layer portion L12. This additional portion 51 is to substitute for the layer portion L12 if the layer portion L12 is a second-type layer portion 10B.

In another additional portion 51, the wires AWC2 and AWR3 are broadened in part so that the electrode 82D1 is electrically connected to the wire AWC2 while the electrode 82D2 is electrically connected to the wire AWR3. This additional portion 51 has the same configuration and function as those of the layer portion L13. This additional portion 51 is to substitute for the layer portion L13 if the layer portion L13 is a second-type layer portion 10B.

In another additional portion 51, the wires AWC2 and AWR4 are broadened in part so that the electrode 82D1 is electrically connected to the wire AWC2 while the electrode 82D2 is electrically connected to the wire AWR4. This additional portion 51 has the same configuration and function as those of the layer portion L14. This additional portion 51 is to substitute for the layer portion L14 if the layer portion L14 is a second-type layer portion 10B.

In another additional portion 51, the wires AWC3 and AWR5 are broadened in part so that the electrode 82D1 is electrically connected to the wire AWC3 while the electrode 82D2 is electrically connected to the wire AWR5. This additional portion 51 has the same configuration and function as those of the layer portion L15. This additional portion 51 is to substitute for the layer portion L15 if the layer portion L15 is a second-type layer portion 10B.

In another additional portion 51, the wires AWC3 and AWR6 are broadened in part so that the electrode 82D1 is electrically connected to the wire AWC3 while the electrode 82D2 is electrically connected to the wire AWR6. This additional portion 51 has the same configuration and function as those of the layer portion L16. This additional portion 51 is to substitute for the layer portion L16 if the layer portion L16 is a second-type layer portion 10B.

In another additional portion 51, the wires AWC4 and AWR7 are broadened in part so that the electrode 82D1 is electrically connected to the wire AWC4 while the electrode 82D2 is electrically connected to the wire AWR7. This additional portion 51 has the same configuration and function as those of the layer portion L17. This additional portion 51 is to substitute for the layer portion L17 if the layer portion L17 is a second-type layer portion 10B.

In another additional portion 51, the wires AWC4 and AWR8 are broadened in part so that the electrode 82D1 is electrically connected to the wire AWC4 while the electrode 82D2 is electrically connected to the wire AWR8. This additional portion 51 has the same configuration and function as those of the layer portion L18. This additional portion 51 is to substitute for the layer portion L18 if the layer portion L18 is a second-type layer portion 10B.

In the second-type layer portion 10B of the layered chip package 1 according to the present embodiment, none of the plurality of electrodes are electrically connected to the semiconductor chip 30. Consequently, the defective semiconductor chip 30 in the second-type layer portion 10B is not electrically connected to the plurality of wires W, and is thus disabled.

According to the present embodiment, if the layered chip package 1 includes one or more second-type layer portions 10B, one or more additional portions 51 to substitute for the one or more second-type layer portions 10B are stacked together with the layered chip package 1 serving as the main package 1 to form a composite layered chip package. The composite layered chip package has the same functions as those of a layered chip package 1 that includes no defective semiconductor chip 30.

When at least one additional portion 51 is used to form a composite layered chip package, the at least one additional portion 51 may be placed on the top or bottom of the main package 1. If the additional portion 51 is placed on the top of the main package 1, the plurality of second additional portion terminals 55 of the additional portion 51 are electrically connected to the plurality of first terminals 4 of the main package 1. If the additional portion 51 is placed on the bottom of the main package 1, the plurality of first additional portion terminals 54 of the additional portion 51 are electrically connected to the plurality of second terminals 5 of the main package 1.

A stack of two or more additional portions 51 may be placed on the top or bottom of the main package 1 to form a composite layered chip package. In such a case, the plurality of second additional portion terminals 55 of the upper one of two vertically adjacent additional portions 51 are electrically connected to the plurality of first additional portion terminals 54 of the lower one. Alternatively, one or more additional portions 51 may be placed on both of the top and bottom of the main package 1 to form a composite layered chip package.

In any of the composite layered chip packages having the foregoing configurations, the additional semiconductor chip 80 in the additional portion 51 is electrically connected to the plurality of wires W of the main package 1 via the additional portion wiring 53 so that the additional semiconductor chip 80 substitutes for a defective semiconductor chip 30 in the main package 1.

Figure 8:
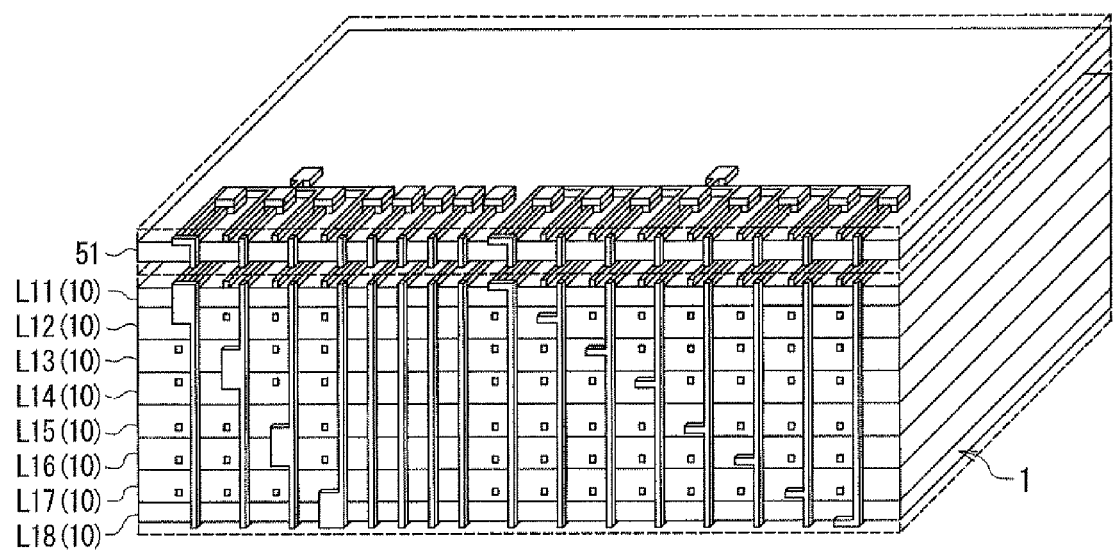
FIG. 8 is a perspective view showing an example of a composite layered chip package of the first embodiment of the invention.

FIG. 8 shows an example of composite layered chip packages. The example shown in FIG. 8 is where the layer portion L11 of the main package 1 is a second-type layer portion 10B. In this example, the additional portion 51 to substitute for the layer portion L11 is placed on the top of the main package 1 to form the composite layered chip package. In the example, the electrodes 82D1 and 82D2 of the additional portion 51 are electrically connected to the wires WC1 and WR1 of the main package 1, respectively, as with the layer portion L11. The additional portion 51 to substitute for the layer portion L11 may be placed on the bottom of the main package 1 to form a composite layered chip package similar to that in the example shown in FIG. 8.

Needless to say, the composite layered chip package of the present embodiment may have a configuration other than that of the example shown in FIG. 8. In the present embodiment, if the main package 1 includes one or more second-type layer portions 10B, one or more additional portions 51 to substitute for the one or more layer portions 10B are selected according to which of the layer portions L11 to L18 is/are the layer portion(s) 10B. The main package 1 and the selected one or more additional portions 51 are then stacked on each other and electrically connected to each other to form a composite layered chip package. Consequently, according to the embodiment, it is possible to easily provide a composite layered chip package having the same functions as those of a layered chip package 1 that includes no defective semiconductor chip 30, regardless of the number and location(s) of the second-type layer portion(s) 10B in the main package 1.

In the present embodiment, there may be prepared an additional portion that includes two or more layer portions including their respective additional semiconductor chips 80, and such an additional portion may be electrically connected to a main package 1 that includes two or more second-type layer portions 10B. In this case, which ones of the layer-dependent wires AWB (wires AWC1 to AWC4 and AWR1 to AWR8) are to be electrically connected with the electrodes 82D1 and 82D2 is determined for each of the layer portions in the additional portion, according to which ones of the layer portions of the main package 1 are to be substituted by the layer portions of the additional portion.

Figure 9:
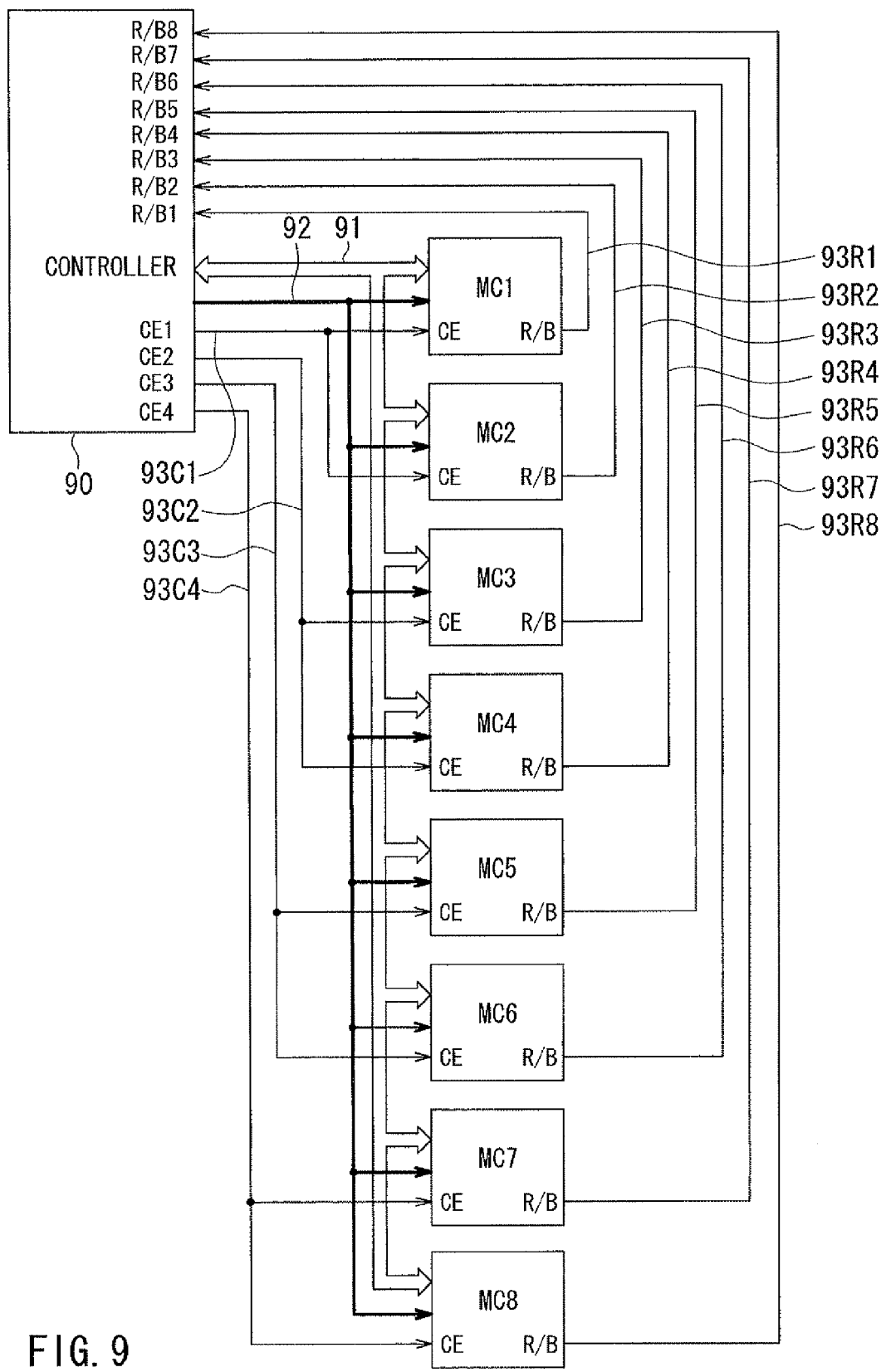
FIG. 9 is a block diagram showing the configuration of a memory device that uses the layered chip package according to the first embodiment of the invention.

Hereinafter, the layered chip package 1 and the composite layered chip package will be described in more detail with reference to a case where the layered chip package 1 according to the embodiment is used to construct a memory device. FIG. 9 is a block diagram showing the configuration of the memory device that uses the layered chip package 1 according to the embodiment. The memory device includes eight memory chips MC1, MC2, MC3, MC4, MC5, MC6, MC7, and MC8, and a controller 90 which controls these memory chips.

The memory chips MC1, MC2, MC3, MC4, MC5, MC6, MC7, and MC8 are the respective semiconductor chips 30 in the layer portions L11, L12, L13, L14, L15, L16, L17, and L18 of the layered chip package 1 shown in FIG. 1 and FIG. 2. Each of the memory chips includes a plurality of memory cells and a peripheral circuit such as an address decoder. The controller 90 is provided independent of the layered chip package 1, and is electrically connected to the plurality of first terminals 4 or second terminals 5 of the layered chip package 1.

The memory device further includes a data bus 91 which electrically connects the controller 90 to the eight memory chips, and one or more common lines 92 which electrically connect the controller 90 to the eight memory chips. Each of the eight memory chips includes a plurality of electrode pads to which the data bus 91 is electrically connected, and one or more electrode pads to which the one or more common lines 92 are electrically connected. The data bus 91 transmits addresses, commands, data, etc. The one or more common lines 92 include power lines as well as signal lines for transmitting signals that are other than those transmitted by the data bus 91 and are used in common by the eight memory chips.

Each of the eight memory chips further includes an electrode pad CE for receiving a chip enable signal and an electrode pad R/B for outputting a ready/busy signal. The chip enable signal is a signal for controlling whether to select or deselect the memory chip. The ready/busy signal is a signal for indicating the operating state of the memory chip.

The memory device shown in FIG. 9 further includes signal lines 93C1, 93C2, 93C3, and 93C4. The signal line 93C1 electrically connects the controller 90 to the electrode pads CE of the memory chips MC1 and MC2, and transmits a chip enable signal CE1. The signal line 93C2 electrically connects the controller 90 to the electrode pads CE of the memory chips MC3 and MC4, and transmits a chip enable signal CE2. The signal line 93C3 electrically connects the controller 90 to the electrode pads CE of the memory chips MC5 and MC6, and transmits a chip enable signal CE3. The signal line 93C4 electrically connects the controller 90 to the electrode pads CE of the memory chips MC7 and MC8, and transmits a chip enable signal CE4. Thus, in the example shown in FIG. 9, the signal line 93C1 is used by the memory chips MC1 and MC2 in common, the signal line 93C2 is used by the memory chips MC3 and MC4 in common, the signal line 93C3 is used by the memory chips MC5 and MC6 in common, and the signal line 93C4 is used by the memory chips MC7 and MC8 in common. Nevertheless, eight signal lines for transmitting respective different chip enable signals to the memory chips may be provided instead of the signal lines 93C1, 93C2, 93C3, and 93C4.

The memory device shown in FIG. 9 further includes signal lines 93R1, 93R2, 93R3, 93R4, 93R5, 93R6, 93R7, and 93R8. One end of each of the signal lines 93R1 to 93R8 is electrically connected to the controller 90. The other ends of the signal lines 93R1 to 93R8 are electrically connected to the electrode pads RB of the memory chips MC1 to MC8, respectively. The signal lines 93R1 to 93R8 transmit ready/busy signals R/B1 to R/B8, respectively.

In the layered chip package 1 shown in FIG. 1 and FIG. 2, the plurality of common wires WA (wires WA1 to WA4) constitute parts of the data bus 91 and the one or more common lines 92. The plurality of common wires WA are thus used for a purpose common to all the layer portions 10 in the main part 2M, i.e., for the purpose of transmitting signals and the like that are used in common by all the semiconductor chips 30 (memory chips) in the main part 2M. The wires WC1, WC2, WC3, and WC4 constitute parts of the signal lines 93C1, 93C2, 93C3, and 93C4, respectively. The wires WR1, WR2, WR3, WR4, WR5, WR6, WR7, and WR8 constitute parts of the signal lines 93R1, 93R2, 93R3, 93R4, 93R5, 93R6, 93R7, and 93R8, respectively.

Figure 10:
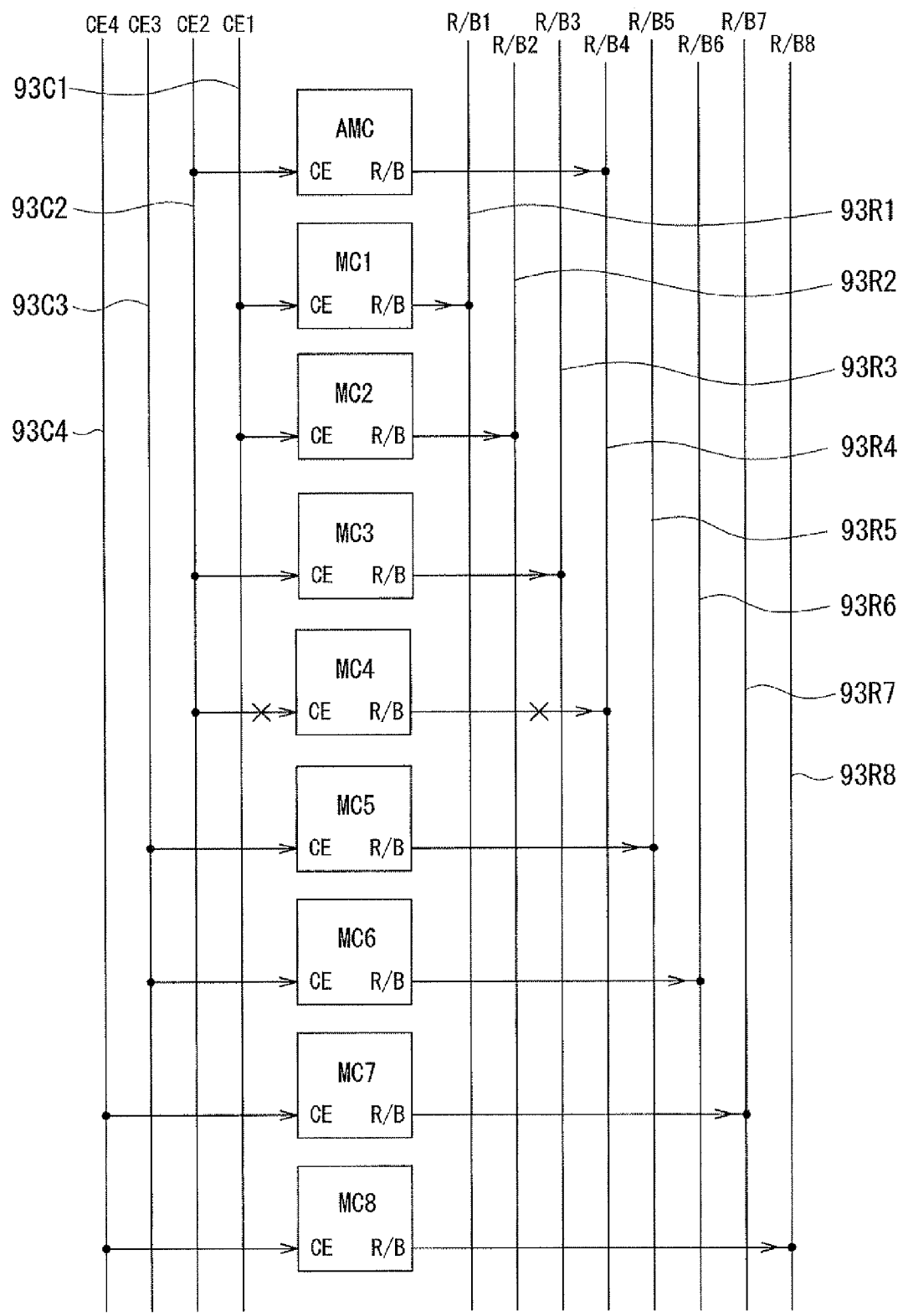
FIG. 10 is a block diagram showing a remedy for coping with situations where the memory device shown in FIG. 9 includes a defective semiconductor chip.

FIG. 9 shows the case where the layered chip package 1 includes no defective semiconductor chip 30 (memory chip). Now, a description will be given of remedies according to the embodiment for coping with situations where the layered chip package 1 includes one or more defective semiconductor chips 30 (memory chips). As one example, FIG. 10 shows a remedy for coping with the situation where the memory chip MC4 of the layer portion L14 is defective. FIG. 10 shows the relationship between the plurality of memory chips and the signal lines 93C1 to 93C4 and 93R1 to 93R8.

The memory chip MC4 being defective, none of the plurality of electrodes of the layer portion L14 are electrically connected to the memory chip MC4. Consequently, the defective memory chip MC4 is not electrically connected to the plurality of wires W, and is thus disabled. In this case, according to the present embodiment, an additional portion 51 to substitute for the layer portion L14 is placed on the top or bottom of the layered chip package 1 serving as the main package 1 to form a composite layered chip package.

In FIG. 10, the memory chip that serves as the additional semiconductor chip 80 of the additional portion 51 is denoted with symbol AMC. The memory chip AMC is electrically connected to the plurality of wires W of the main package 1 via the additional portion wiring 53. In particular, the electrodes 82D1 and 82D2 of the additional portion 51 are electrically connected to the wires WC2 and WR4 of the main package 1, respectively, as with the layer portion L14. Consequently, as shown in FIG. 10, the electrode pads CE and R/B of the memory chip AMC are electrically connected to the signal lines 93C2 and 93R4, respectively. This allows the composite layered chip package to have the same functions as those of a layered chip package 1 that includes no defective semiconductor chip 30 (memory chip).

Figure 11:
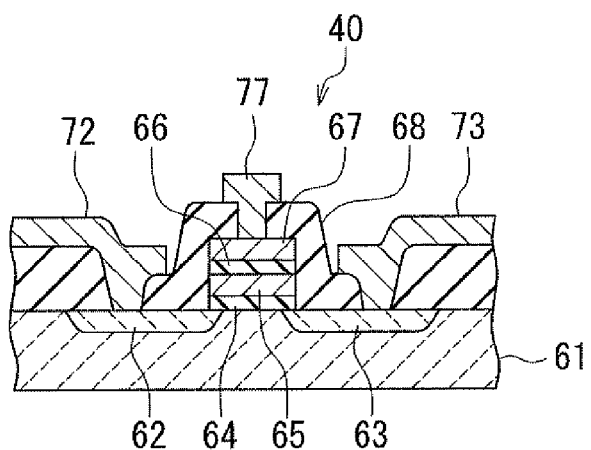
FIG. 11 is a cross-sectional view showing an example of a memory cell included in the semiconductor chip.

Reference is now made to FIG. 11 to describe an example of the configuration of the memory cells included in the semiconductor chip 30 (memory chip). The memory cell 40 shown in FIG. 11 includes a source 62 and a drain 63 formed near a surface of a P-type silicon substrate 61. The source 62 and the drain 63 are both N-type regions. The source 62 and the drain 63 are disposed at a predetermined distance from each other so that a channel composed of a part of the P-type silicon substrate 61 is provided between the source 62 and the drain 63. The memory cell 40 further includes an insulating film 64, a floating gate 65, an insulating film 66, and a control gate 67 that are stacked in this order on the surface of the substrate 61 at the location between the source 62 and the drain 63. The memory cell 40 further includes an insulating layer 68 that covers the source 62, the drain 63, the insulating film 64, the floating gate 65, the insulating film 66 and the control gate 67. The insulating layer 68 has contact holes that open in the tops of the source 62, the drain 63 and the control gate 67, respectively. The memory cell 40 includes a source electrode 72, a drain electrode 73, and a control gate electrode 77 that are formed on the insulating layer 68 at locations above the source 62, the drain 63 and the control gate 67, respectively. The source electrode 72, the drain electrode 73 and the control gate electrode 77 are connected to the source 62, the drain 63 and the control gate 67, respectively, through the corresponding contact holes.

A description will now be given of a method of manufacturing the layered chip package 1 according to the present embodiment. The method of manufacturing the layered chip package 1 according to the embodiment is a method by which a plurality of layered chip packages 1 are manufactured. The method includes the steps of fabricating a layered substructure by stacking three or more substructures each of which includes a plurality of preliminary layer portions that are arrayed, each of the preliminary layer portions being intended to become any one of the three or more layer portions 10 included in the main part 2M, the three or more substructures being intended to be cut later at positions of boundaries between every adjacent ones of the preliminary layer portions; and producing a plurality of layered chip packages 1 from the layered substructure.

Figure 12:
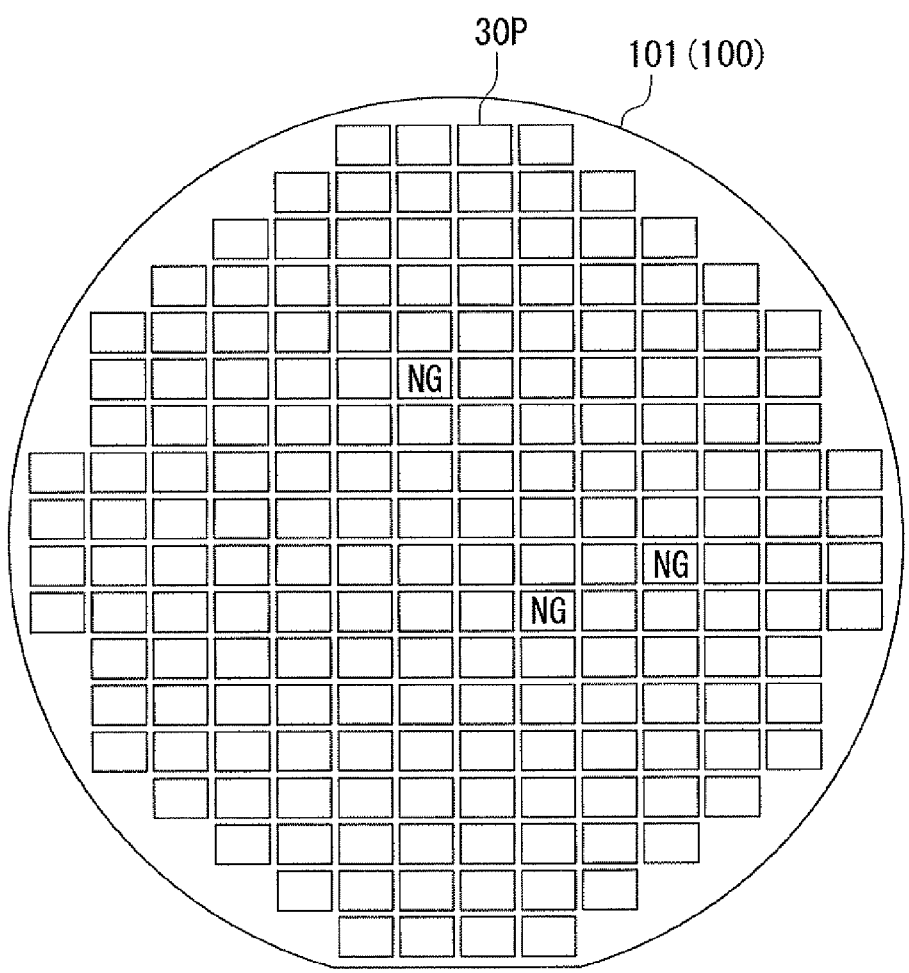
FIG. 12 is a plan view showing a pre-substructure wafer fabricated in a step of a method of manufacturing the layered chip package according to the first embodiment of the invention.
Figure 13:
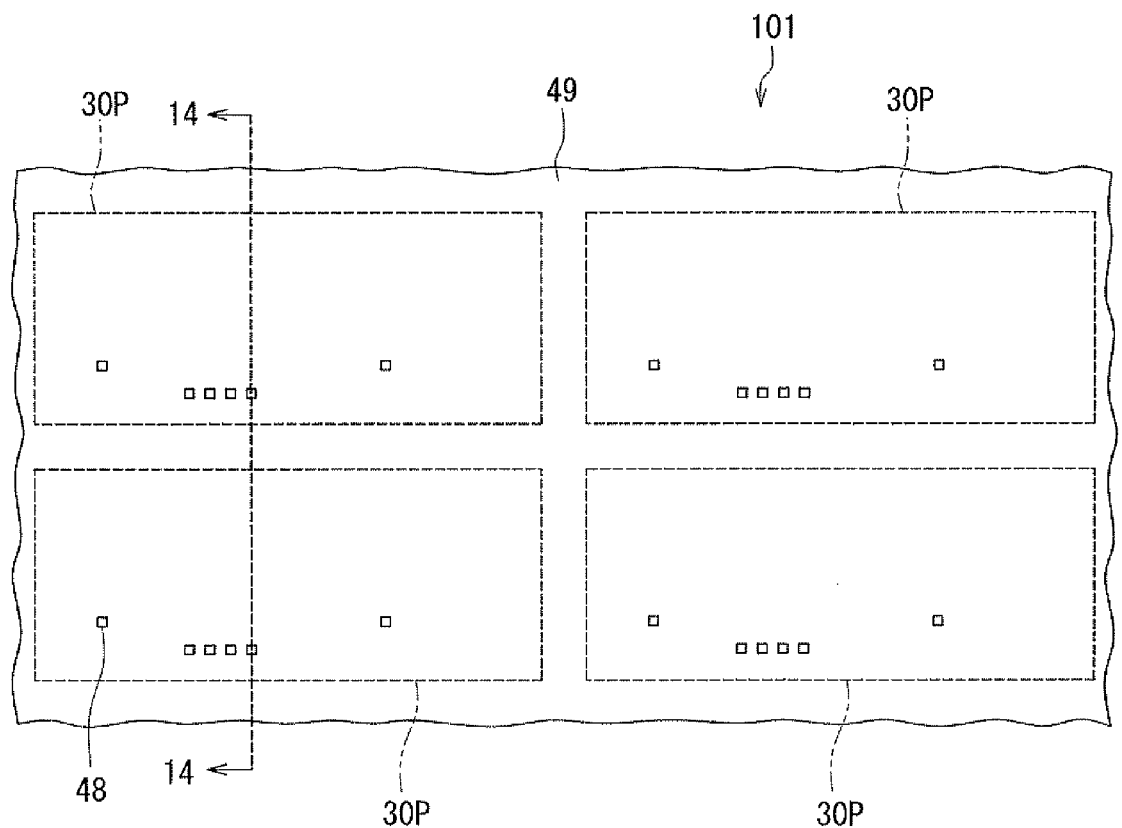
FIG. 13 is a magnified plan view of a part of the pre-substructure wafer shown in FIG. 12.
Figure 14:
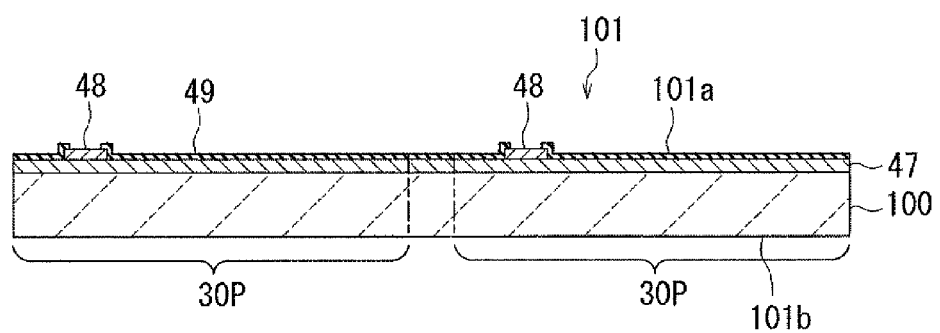
FIG. 14 shows a cross section taken along line 14-14 of FIG. 13.

The step of fabricating the layered substructure will now be described in detail with reference to FIG. 12 to FIG. 27. In the step of fabricating the layered substructure, a pre-substructure wafer 101 is fabricated first. The pre-substructure wafer 101 includes a plurality of pre-semiconductor-chip portions 30P that are arrayed. The pre-semiconductor-chip portions 30P are to become individual semiconductor chips 30. FIG. 12 is a plan view of the pre-substructure wafer 101. FIG. 13 is a magnified plan view of a part of the pre-substructure wafer 101 shown in FIG. 12. FIG. 14 shows a cross section taken along line 14-14 of FIG. 13.

Specifically, in the step of fabricating the pre-substructure wafer 101, the pre-substructure wafer 101 is fabricated by performing processing, such as a wafer process, on one of two surfaces of a semiconductor wafer 100 that face toward opposite directions. The pre-substructure wafer 101 includes a plurality of pre-semiconductor-chip portions 30P that are arrayed. Each of the pre-semiconductor-chip portions 30P includes a device. In the pre-substructure wafer 101, the plurality of pre-semiconductor-chip portions 30P may be in a row, or in a plurality of rows such that a number of pre-semiconductor-chip portions 30P are aligned both in vertical and horizontal directions. The following description assumes that the plurality of pre-semiconductor-chip portions 30P in the pre-substructure wafer 101 are in a plurality of rows such that a number of pre-semiconductor-chip portions 30P are aligned both in vertical and horizontal directions. The semiconductor wafer 100 may be a silicon wafer, for example. The wafer process is a process in which a semiconductor wafer is processed into a plurality of devices yet to be separated into a plurality of chips. For ease of understanding, FIG. 12 depicts the pre-semiconductor-chip portions 30P larger relative to the semiconductor wafer 100. For example, if the semiconductor wafer 100 is a 12-inch wafer and the top surface of each pre-semiconductor-chip portion 30 is 8 to 10 mm long at each side, then 700 to 900 pre-semiconductor-chip portions 30P are obtainable from a single semiconductor wafer 100.

As shown in FIG. 14, the pre-semiconductor-chip portions 30P include a device-forming region 47 formed near one of the two surfaces of the semiconductor wafer 100. The device-forming region 47 is a region where devices are formed by processing the one of the two surfaces of the semiconductor wafer 100. The pre-semiconductor-chip portions 30P further include a plurality of electrode pads 48 disposed on the device-forming region 47, and a passivation film 49 disposed on the device-forming region 47. The passivation film 49 is made of an insulating material such as phospho-silicate-glass (PSG), silicon nitride, or polyimide resin. The passivation film 49 has a plurality of openings for exposing the top surfaces of the plurality of electrode pads 48. The plurality of electrode pads 48 are located in the positions corresponding to the plurality of electrodes to be formed later, and are electrically connected to the devices formed in the device-forming region 47. Hereinafter, the surface of the pre-substructure wafer 101 located closer to the plurality of electrode pads 48 and the passivation film 49 will be referred to as a first surface 101a, and the opposite surface will be referred to as a second surface 101b.

In the step of fabricating the layered substructure, next, a wafer sort test is performed to distinguish the plurality of pre-semiconductor-chip portions 30P included in the pre-substructure wafer 101 into non-malfunctioning pre-semiconductor-chip portions and malfunctioning pre-semiconductor-chip portions. In this step, a probe of a testing device is brought into contact with the plurality of electrode pads 48 of each pre-semiconductor-chip portion 30P so that whether the pre-semiconductor-chip portion 30P functions normally or not is tested with the testing device. In FIG. 12, the pre-semiconductor-chip portions 30P marked with "NG" are malfunctioning ones, and the other pre-semiconductor-chip portions 30P are non-malfunctioning ones. This step provides location information on non-malfunctioning pre-semiconductor-chip portions 30P and malfunctioning pre-semiconductor-chip portions 30P in each pre-substructure wafer 101. The location information is used in a step to be performed later. The passivation film 49 may be formed after the wafer sort test, and may thus be yet to be formed at the time of performing the wafer sort test.

Figure 15:
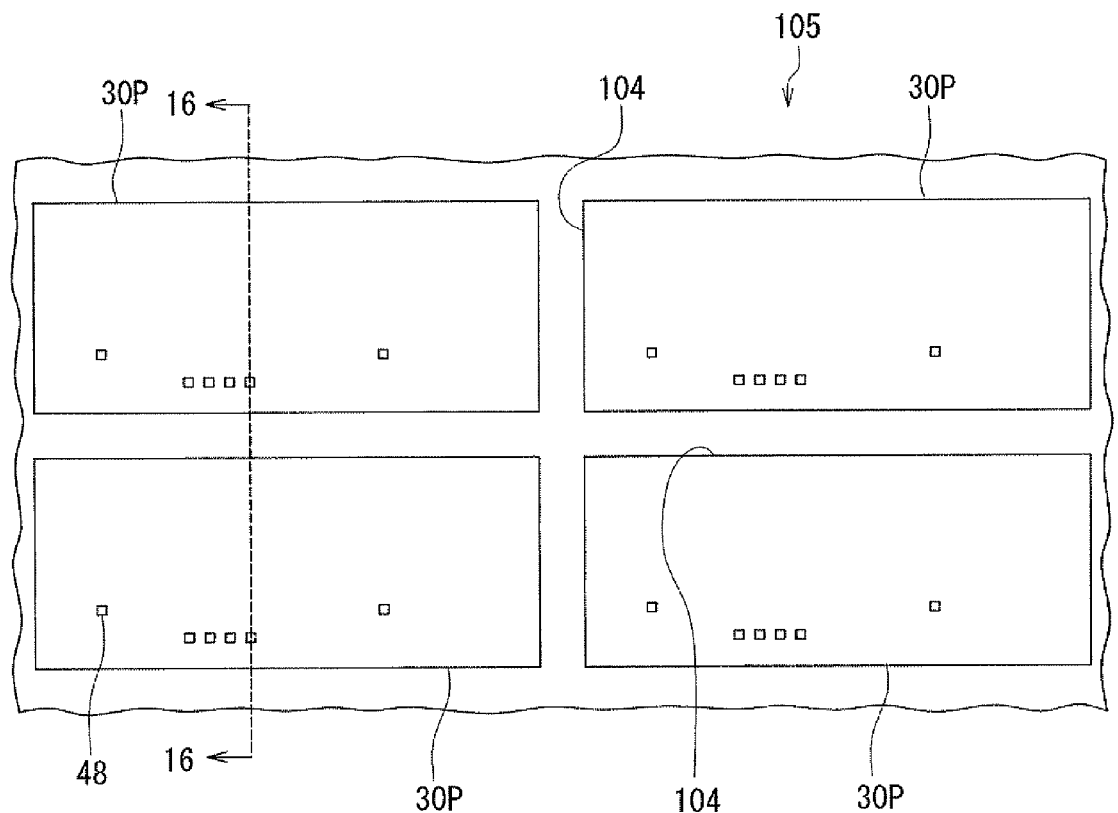
FIG. 15 is a plan view showing a step that follows the step shown in FIG. 13.
Figure 16:
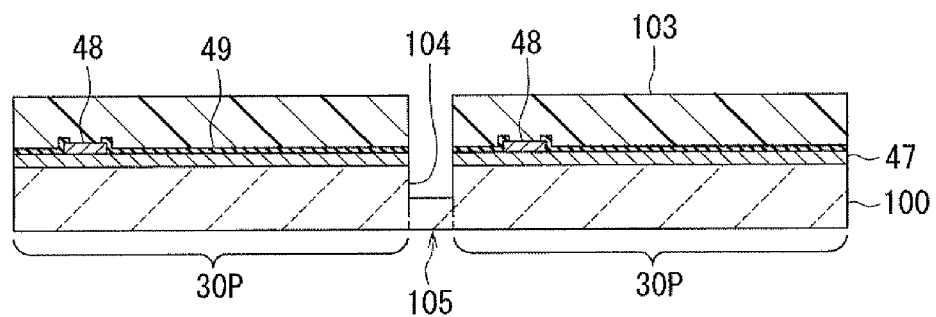
FIG. 16 shows a cross section taken along line 16-16 of FIG. 15.

FIG. 15 is a plan view showing a step that follows the step shown in FIG. 13. FIG. 16 shows a cross section taken along line 16-16 of FIG. 15. In this step, first, a protection layer 103 is formed to cover the first surface 101a of the pre-substructure wafer 101. The protection layer 103 is made of a photoresist, for example. Next, a plurality of grooves 104 that open in the first surface 101a of the pre-substructure wafer 101 are formed in the pre-substructure wafer 101 so as to define the respective areas of the plurality of pre-semiconductor-chip portions 30P. Note that the protection layer 103 is not shown in FIG. 15.

In the positions of boundaries between every two adjacent pre-semiconductor-chip portions 30P, the grooves 104 are formed to pass through the boundaries between every two adjacent pre-semiconductor-chip portions 30P. The grooves 104 are formed such that their bottoms do not reach the second surface 101b of the pre-substructure wafer 101. The grooves 104 have a width in the range of 50 to 150 µm, for example. The grooves 104 have a depth in the range of 20 to 80 µm, for example.

The grooves 104 may be formed using a dicing saw or by performing etching, for example. The etching may be reactive ion etching or anisotropic wet etching using KOH as the etching solution, for example. When forming the grooves 104 by etching, an etching mask may be formed by patterning the protection layer 103 by photolithography. The protection layer 103 is removed after the grooves 104 are formed. As a result, there is formed a pre-polishing substructure main body 105. The pre-substructure wafer 101 with the plurality of grooves 104 formed therein constitutes the pre-polishing substructure main body 105.

Figure 17:
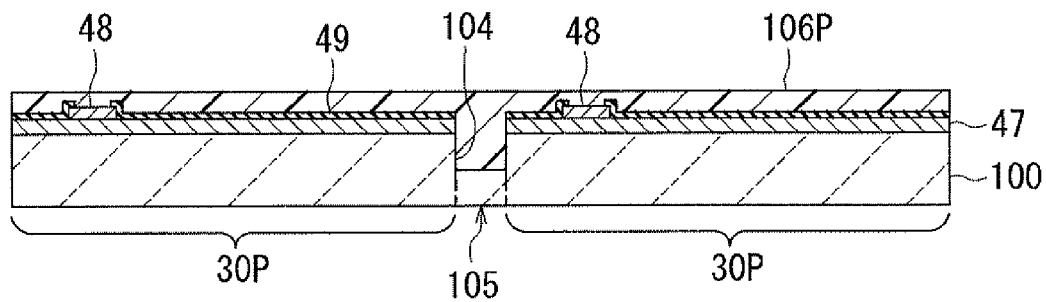
FIG. 17 is a cross-sectional view showing a step that follows the step shown in FIG. 16.

FIG. 17 shows a step that follows the step shown in FIG. 16. In this step, an insulating film 106P is formed to fill the plurality of grooves 104 of the pre-polishing substructure main body 105 and to cover the plurality of electrode pads 48 and the passivation film 49. The insulating film 106P is to later become part of the insulating portion 31. The insulating film 106P may be formed of a resin such as an epoxy resin or a polyimide resin. The insulating film 106P may also be formed of a photosensitive material such as a sensitizer-containing polyimide resin. The insulating film 106P may also be formed of an inorganic material such as silicon oxide or silicon nitride.

It is preferred that the insulating film 106P be formed of a resin having a low thermal expansion coefficient. If the insulating film 106P is formed of a resin having a low thermal expansion coefficient, it becomes easy to cut the insulating film 106P when it is cut later with a dicing saw.

The insulating film 106P is preferably transparent. If the insulating film 106P is transparent, alignment marks that are recognizable through the insulating film 106P can be formed on the insulating film 106P. Such alignment marks facilitates alignment of a plurality of substructures to be stacked.

The insulating film 106P may include a first layer that fills the plurality of grooves 104, and a second layer that covers the first layer, the electrode pads 48 and the passivation film 49. In such a case, the first layer and the second layer may be formed of the same material or different materials. The first layer is preferably formed of a resin having a low thermal expansion coefficient. The second layer may be formed of a photosensitive material such as a sensitizer-containing polyimide resin. The first layer may be flattened at the top by, for example, ashing or chemical mechanical polishing (CMP) before forming the second layer on the first layer.

If the passivation film 49 is not formed by the time of performing the wafer sort test, the second layer of the insulating film 106P may be used as the passivation film. In such a case, the second layer may be formed of an inorganic material such as silicon oxide or silicon nitride. If the second layer of the insulating film 106P is to be used as the passivation film, the plurality of openings for exposing the top surfaces of the plurality of electrode pads 48 are not formed in the second layer as initially formed.

Figure 18:
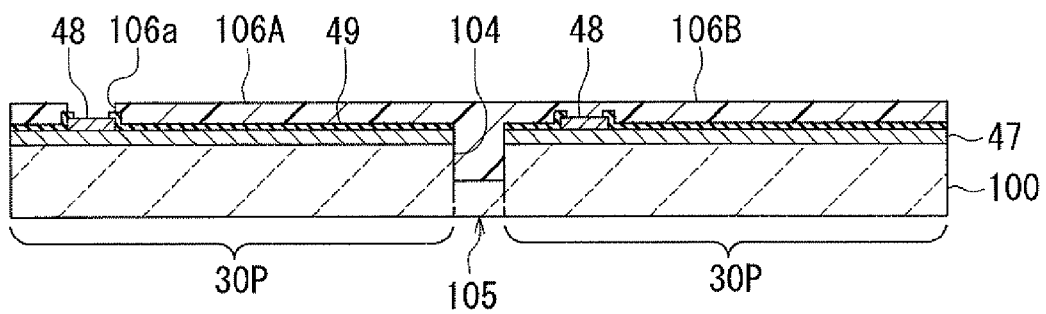
FIG. 18 is a cross-sectional view showing a step that follows the step shown in FIG. 17.

Reference is now made to FIG. 18 to describe the step of forming the plurality of openings for exposing the plurality of electrode pads 48 in the insulating film 106P in the non-malfunctioning pre-semiconductor-chip portions 30P. FIG. 18 shows a step that follows the step shown in FIG. 17.

Here, a description will initially be given of a case where either the entire insulating film 106P or the second layer of the insulating film 106P is formed of a negative photosensitive material and photolithography is employed to form the openings in the insulating film 106P. In this example, first, all the pre-semiconductor-chip portions 30P are simultaneously subjected to the exposure of the insulating film 106P by using a first mask (not shown). The first mask has such a pattern that the areas of the insulating film 106P where to form the openings are not irradiated with light while the other areas are irradiated with light. The non-irradiated areas of the insulating film 106P are soluble in a developing solution, and the irradiated areas become insoluble in the developing solution.

Next, using a stepping projection exposure apparatus, or a so-called stepper, the insulating film 106P is selectively exposed in the malfunctioning pre-semiconductor-chip portions 30P only, using a second mask (not shown). This step uses the location information on non-malfunctioning pre-semiconductor-chip portions 30P and malfunctioning pre-semiconductor-chip portions 30P in each pre-substructure wafer 101 which was obtained by the wafer sort test. In FIG. 18, the pre-semiconductor-chip portion 30P on the left is a non-malfunctioning one, whereas the pre-semiconductor-chip portion 30P on the right is a malfunctioning one. The second mask entirely transmits light. As a result of this exposure process, the entire insulating film 106P in each malfunctioning pre-semiconductor-chip portion 30P becomes insoluble in the developing solution.

Next, the insulating film 106P is developed with the developing solution. As a result, as shown in FIG. 18, a plurality of openings 106a for exposing the plurality of electrode pads 48 are formed in the insulating film 106P in each non-malfunctioning pre-semiconductor-chip portion 30P (the left side). On the other hand, no openings 106a are formed in the insulating film 106P in each malfunctioning pre-semiconductor-chip portion 30P (the right side). After the development, the area of the insulating film 106P corresponding to the non-malfunctioning pre-semiconductor-chip portion 30P becomes a first-type insulating layer 106A, and the area corresponding to the malfunctioning pre-semiconductor-chip portion 30P becomes a second-type insulating layer 106B. The first-type insulating layer 106A has the plurality of openings 106a for exposing the plurality of electrode pads 48 and surrounds the plurality of electrode pads 48. The second-type insulating layer 106B covers the plurality of electrode pads 48 so as to avoid exposure.

Now, an example of the method for forming the plurality of openings 106a in the insulating film 106P will be described for the case where either the entire insulating film 106P or the second layer of the insulating film 106P is formed of a non-photosensitive material. In this example, first, a negative photoresist layer is formed on the insulating film 106P. The photoresist layer is then exposed and developed by the same method as with the exposure and development of the insulating film 106P described above. Consequently, in the non-malfunctioning pre-semiconductor-chip portions 30P, a plurality of openings are formed in the photoresist layer at positions corresponding to the plurality of electrode pads 48. Meanwhile, no opening is formed in the photoresist layer in the malfunctioning pre-semiconductor-chip portions 30P. Next, the insulating film 106P is selectively etched by using the photoresist layer as the etching mask, whereby the plurality of openings 106a are formed in the insulating film 106P. The photoresist layer may be subsequently removed, or may be left and used as part of the insulating layers 106A and 106B.

Figure 19:
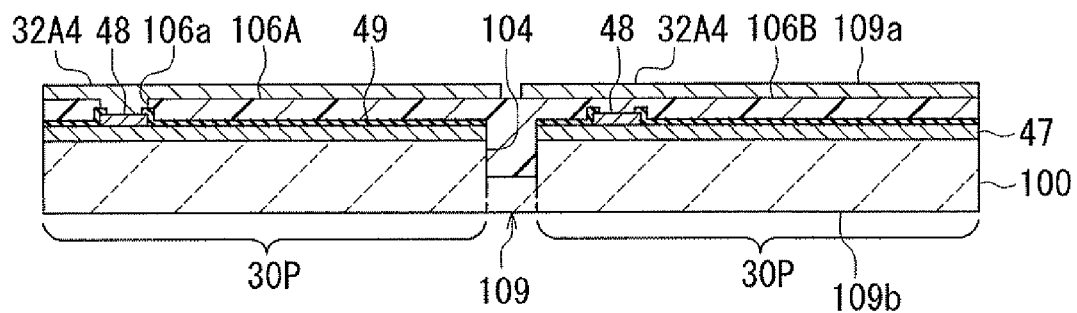
FIG. 19 is a cross-sectional view showing a step that follows the step shown in FIG. 18.
Figure 20:
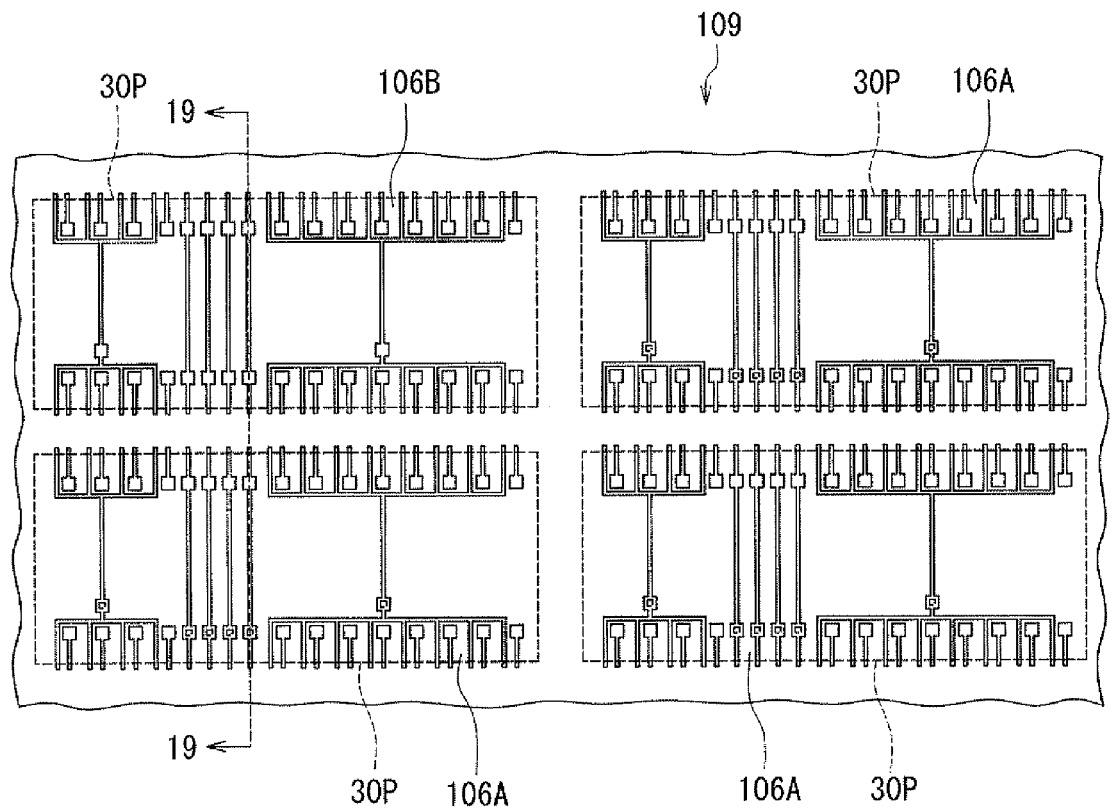
FIG. 20 is a plan view showing the step of FIG. 19.

FIG. 19 and FIG. 20 show a step that follows the step shown in FIG. 18. FIG. 19 shows a cross section taken along line 19-19 of FIG. 20. In this step, the plurality of electrodes are formed on the insulating layers 106A and 106B by plating, for example. In each of the non-malfunctioning pre-semiconductor-chip portions 30P, the first-type electrodes 32A1 to 32A4 and the sixth-type electrodes 32D1 and 32D2 among the plurality of electrodes are in contact with and electrically connected to the respective corresponding electrode pads 48 through the plurality of openings 106a of the insulating layer 106A. In each of the non-malfunctioning pre-semiconductor-chip portions 30P, the plurality of electrodes other than the first-type and sixth-type electrodes are not in contact with the pre-semiconductor-chip portion 30P. In each of the malfunctioning pre-semiconductor-chip portions 30P, on the other hand, none of the electrodes are in contact with the pre-semiconductor-chip portion 30P since no openings 106a are formed in the insulating layer 106B.

In this way, there is fabricated a pre-polishing substructure 109 shown in FIG. 19 and FIG. 20. The pre-polishing substructure 109 has a first surface 109a corresponding to the first surface 101a of the pre-substructure wafer 101, and a second surface 109b corresponding to the second surface 101b of the pre-substructure wafer 101.

The electrodes are formed of a conductive material such as Cu. In the case of forming the electrodes by plating, a seed layer for plating is initially formed. Next, a photoresist layer is formed on the seed layer. The photoresist layer is then patterned by photolithography to form a frame that has a plurality of openings in which the electrodes are to be accommodated later. Next, plating layers that are intended to constitute respective portions of the electrodes are formed by plating on the seed layer in the openings of the frame. The plating layers have a thickness in the range of 5 to 15 µm, for example. Next, the frame is removed, and portions of the seed layer other than those lying under the plating layers are also removed by etching. The plating layers and the remaining portions of the seed layer under the plating layers thus form the electrodes.

Figure 21:
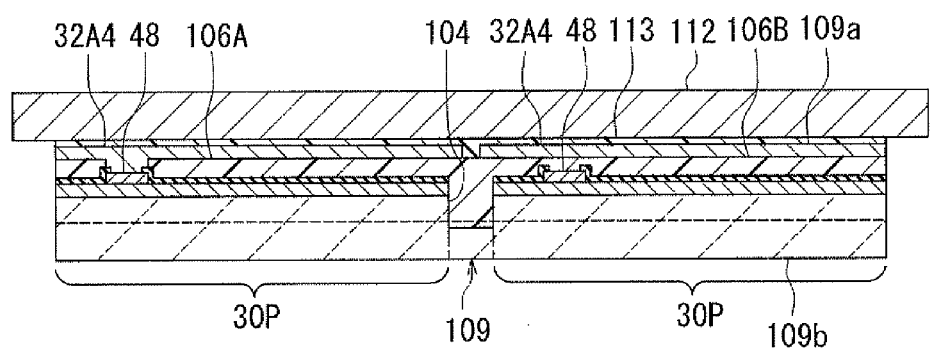
FIG. 21 is a cross-sectional view showing a step that follows the step shown in FIG. 19.

FIG. 21 shows a step that follows the step shown in FIG. 19. In this step, using an insulating adhesive, the pre-polishing substructure 109 is bonded to a plate-shaped jig 112 shown in FIG. 21, with the first surface 109a of the pre-polishing substructure 109 arranged to face a surface of the jig 112. The pre-polishing substructure 109 bonded to the jig 112 will hereinafter be referred to as a first pre-polishing substructure 109. In FIG. 21, the reference numeral 113 indicates an insulating layer formed by the adhesive. The insulating layer 113 is to become part of the insulating portion 31 later.

Figure 22:
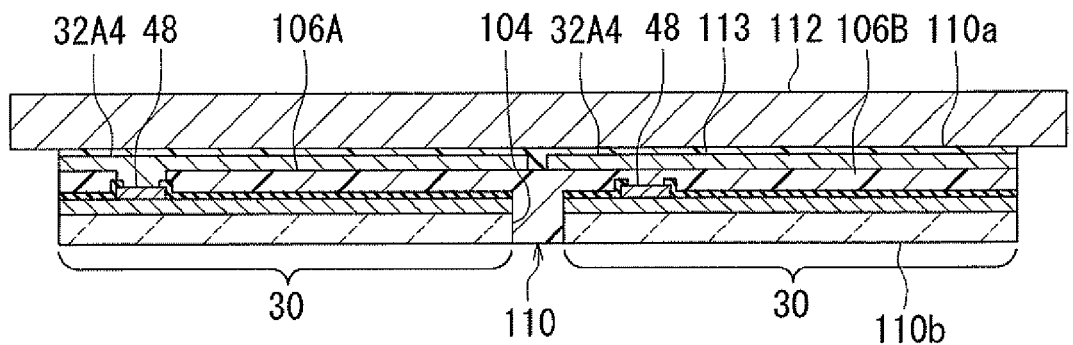
FIG. 22 is a cross-sectional view showing a step that follows the step shown in FIG. 21.

FIG. 22 shows a step that follows the step shown in FIG. 21. In this step, the second surface 109b of the first pre-polishing substructure 109 is polished. The polishing is performed until the plurality of grooves 104 are exposed. The broken line in FIG. 21 indicates the level of the second surface 109b after the polishing. By polishing the second surface 109b of the first pre-polishing substructure 109, the first pre-polishing substructure 109 is reduced in thickness. Consequently, there is formed a substructure 110 bonded to the jig 112. The substructure 110 has a thickness of 20 to 80 µm, for example. The substructure 110 bonded to the jig 112 will hereinafter be referred to as a first substructure 110. The first substructure 110 has a first surface 110a corresponding to the first surface 109a of the first pre-polishing substructure 109, and a second surface 110b opposite to the first surface 110a. The second surface 110b is the polished surface. By polishing the second surface 109b of the first pre-polishing substructure 109 until the plurality of grooves 104 are exposed, the plurality of pre-semiconductor-chip portions 30P are separated from each other into individual semiconductor chips 30. The first surface 110a of the first substructure 110 corresponds to the first surface 30a of the semiconductor chip 30 shown in FIG. 4. The second surface 110b of the first substructure 110 corresponds to the second surface 30b of the semiconductor chip 30 shown in FIG. 4.

Figure 23:
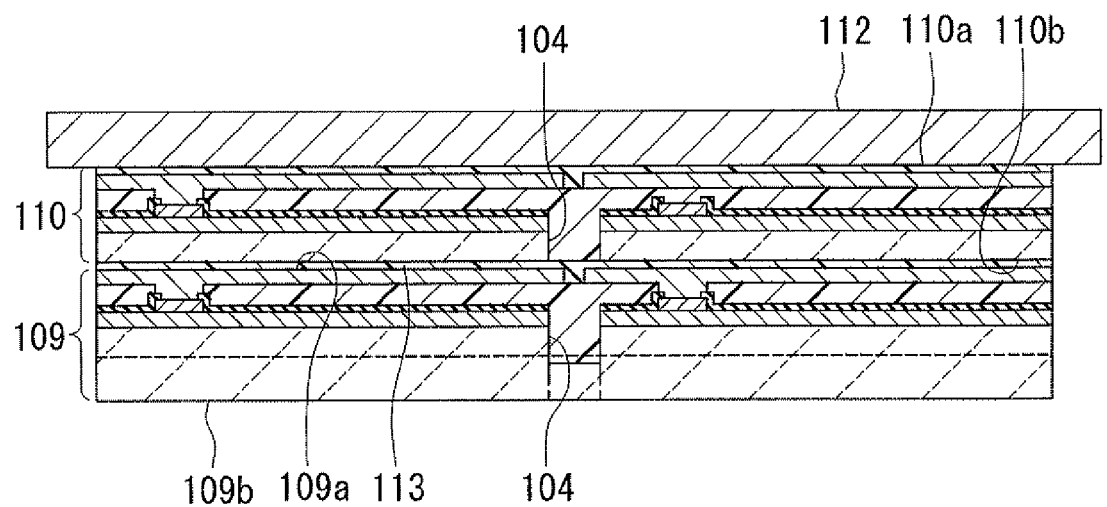
FIG. 23 is a cross-sectional view showing a step that follows the step shown in FIG. 22.

FIG. 23 shows a step that follows the step shown in FIG. 22. In this step, using an insulating adhesive, a pre-polishing substructure 109 is bonded to the first substructure 110 bonded to the jig 112. The pre-polishing substructure 109 is bonded to the first substructure 110 with the first surface 109a arranged to face the polished surface, i.e., the second surface 110b, of the first substructure 110. The pre-polishing substructure 109 bonded to the first substructure 110 will hereinafter be referred to as a second pre-polishing substructure 109. The insulating layer 113 formed of the adhesive between the first substructure 110 and the second pre-polishing substructure 109 covers the plurality of electrodes of the second pre-polishing substructure 109. The insulating layer 113 is to later become part of the insulating portion 31.

Figure 24:
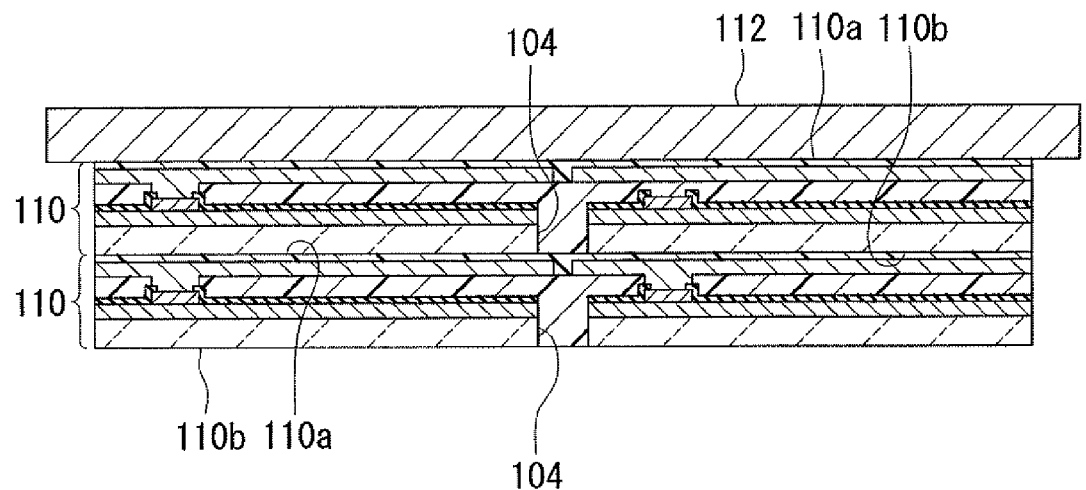
FIG. 24 is a cross-sectional view showing a step that follows the step shown in FIG. 23.

FIG. 24 shows a step that follows the step shown in FIG. 23. In this step, the second surface 109b of the second pre-polishing substructure 109 is polished. The polishing is performed until the plurality of grooves 104 are exposed. The broken line in FIG. 23 indicates the level of the second surface 109b after the polishing. By polishing the second surface 109b of the second pre-polishing substructure 109, the second pre-polishing substructure 109 is reduced in thickness. Consequently, there is formed a second substructure 110 bonded to the first substructure 110. The second substructure 110 has a thickness of 20 to 80 µm, for example, as does the first substructure 110.

Figure 25:
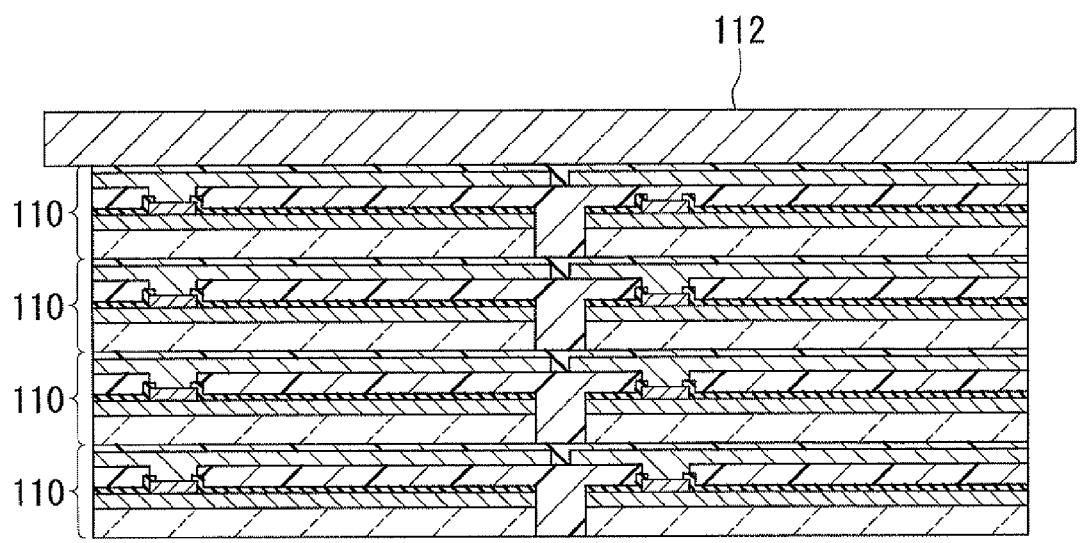
FIG. 25 is a cross-sectional view showing a step that follows the step shown in FIG. 24.

The same steps as those shown in FIG. 23 and FIG. 24 may be repeated to form a stack including three or more substructures 110 stacked on one another. FIG. 25 shows a state where a stack including four substructures 110 stacked on one another has been formed. This stack will hereinafter be referred to as a first stack.

Figure 26:
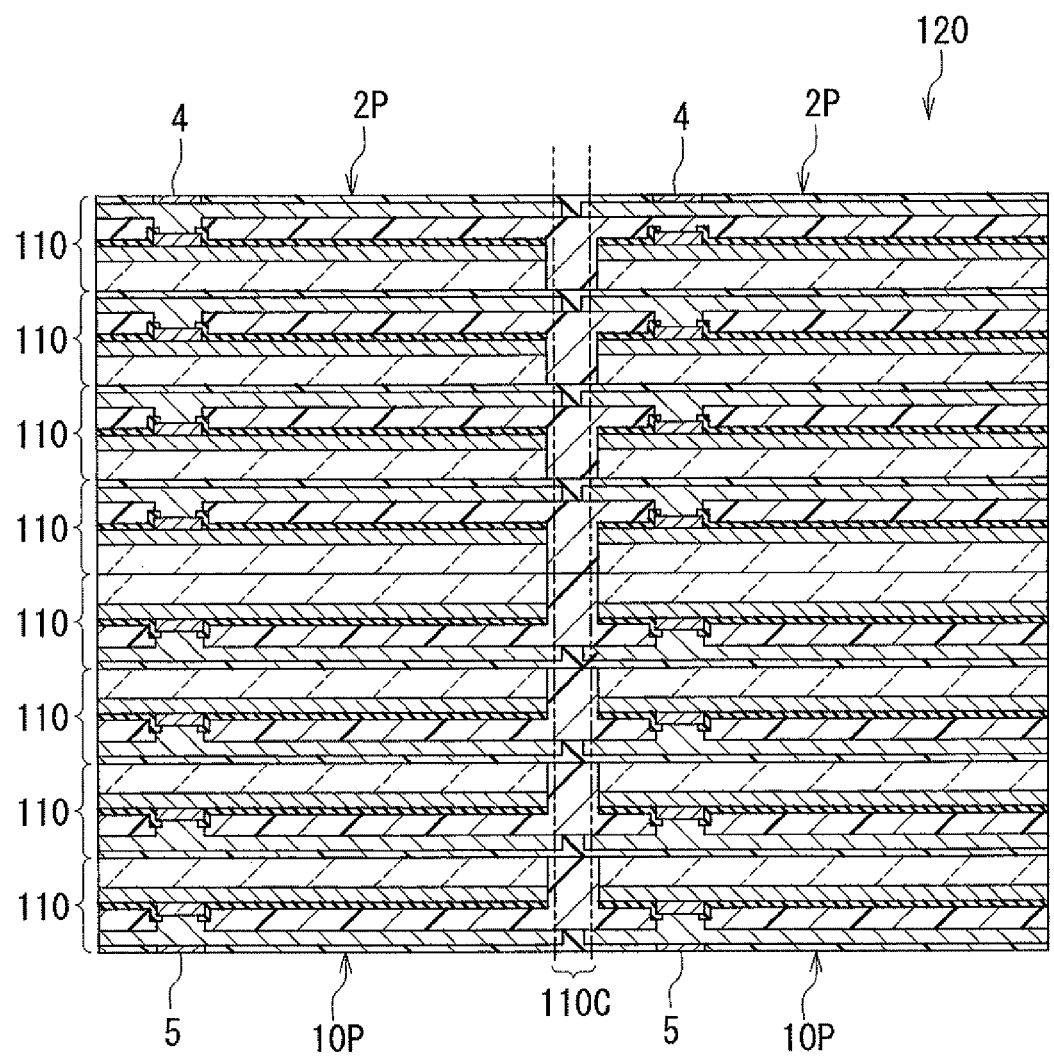
FIG. 26 is a cross-sectional view showing a layered substructure fabricated in a step that follows the step shown in FIG. 25.

FIG. 26 shows a step that follows the step shown in FIG. 25. In this step, first, the same steps as those shown in FIG. 21 to FIG. 25 are repeated to form a second stack including four substructures 110 stacked on one another. Next, a third stack including eight substructures 110 stacked on one another is formed using the first and second stacks. The third stack is formed such that the respective second surfaces 110b of two of the eight substructures 110 face toward each other, the two of the eight substructures 110 being located at opposite ends in the stacking direction of the eight substructures 110. More specifically, the third stack is formed by bonding the first stack and the second stack to each other using an insulating adhesive (not shown), such that the second surface 110b of the last-formed substructure 110 in the first stack and the second surface 110b of the last-formed substructure 110b in the second stack face each other. The two jigs 112 are then released from the third stack.

Next, part of the insulating layer 113 of the uppermost substructure 110 in the third stack and part of the insulating layer 113 of the lowermost substructure 110 in the third stack are removed by, for example, etching, to expose the first and second terminal component parts of the plurality of electrodes, and a plurality of conductor pads are then formed. Then, a plurality of conductor layers are formed on the plurality of conductor pads to thereby form the plurality of first terminals 4 and the plurality of second terminals 5.

At least either the terminals 4 or the terminals 5 may each include a solder layer made of a solder material, the solder layer being exposed in the surface of each of the terminals 4 or each of the terminals 5. An example of the solder material is AuSn. The solder layer has a thickness in the range of 1 to 2 µm, for example. The solder layer is formed on the surface of each of the electrodes directly or via an underlayer by plating, for example.

AuSn is highly adhesive to Au. When either the terminals 4 or the terminals 5 each include a solder layer made of AuSn, it is preferred that the other of the terminals 4 and 5 each include an Au layer that is exposed in the surface of each of the terminals 4 or 5. The Au layer is formed by plating or sputtering, for example. The melting point of AuSn varies according to the ratio between Au and Sn. For example, if the ratio between Au and Sn is 1:9 by weight, AuSn has a melting point of 217° C. If the ratio between Au and Sn is 8:2 by weight, AuSn has a melting point of 282° C.

Figure 27:
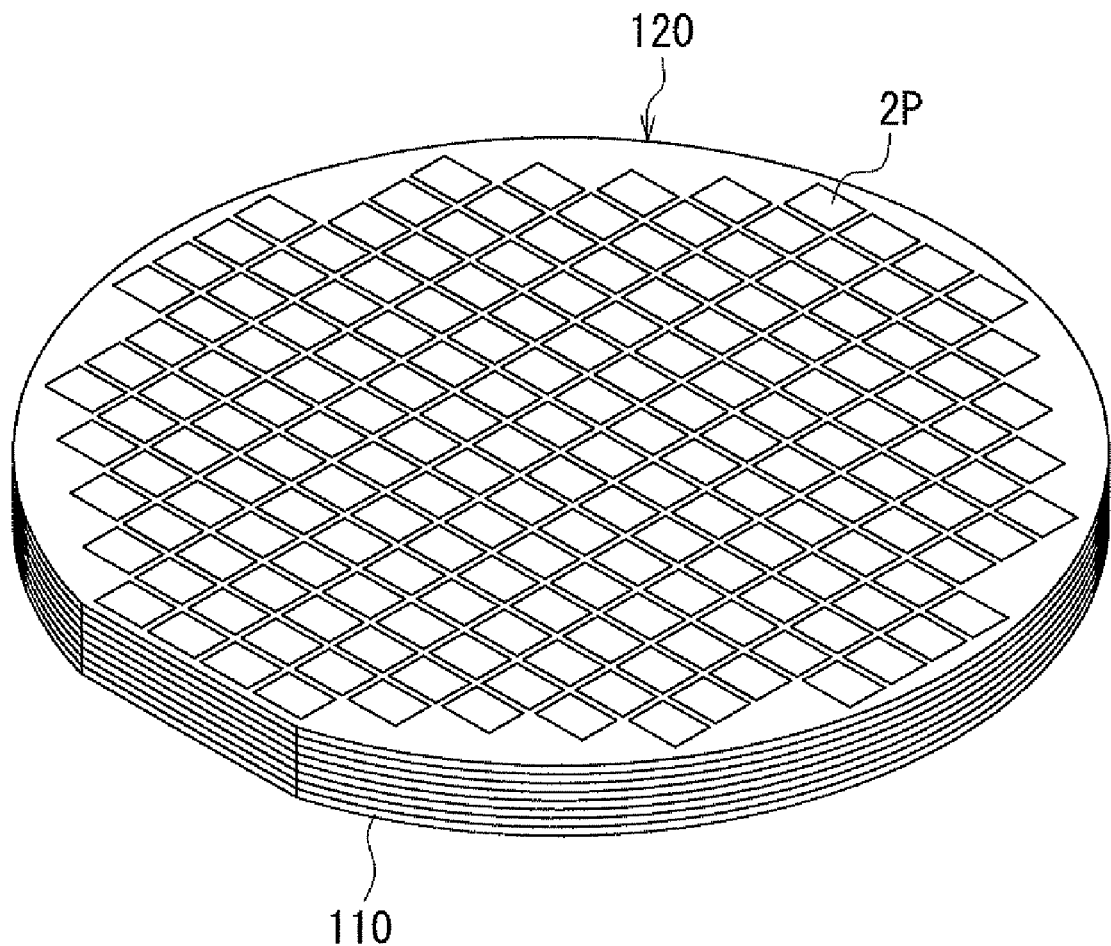
FIG. 27 is a perspective view of the layered substructure shown in FIG. 26.

In this way, there is formed a layered substructure 120 shown in FIG. 26. FIG. 27 is a perspective view of the layered substructure 120. Each of the substructures 110 includes a plurality of preliminary layer portions 10P that are arrayed. Each of the preliminary layer portions 10P is to become any one of the layer portions 10 included in the main part 2M of the main body 2. The substructures 110 are to be cut later in the positions of the boundaries between every adjacent preliminary layer portions 10P. In FIG. 26, the reference symbol 110C indicates the cutting positions in the substructures 110. The layered substructure 120 includes a plurality of pre-separation main bodies 2P that are arrayed. The plurality of pre-separation main bodies 2P are to be separated from each other later into individual main bodies 2. In the example shown in FIG. 26, each of the pre-separation main bodies 2P includes eight preliminary layer portions 10P. The eight preliminary layer portions 10P included in each of the pre-separation main bodies 2P are to become the layer portions L11, L12, L13, L14, L15, L16, L17, and L18 in the order from top to bottom.

Now, with reference to FIG. 28 and FIG. 29, a detailed description will be given of the step of producing a plurality of layered chip packages 1 from the layered substructure 120. The following description will deal with an example where the layered substructure 120 including eight substructures 110 shown in FIG. 26 is used to produce a plurality of layered chip packages 1 each of which includes eight layer portions 10.

Figure 28:
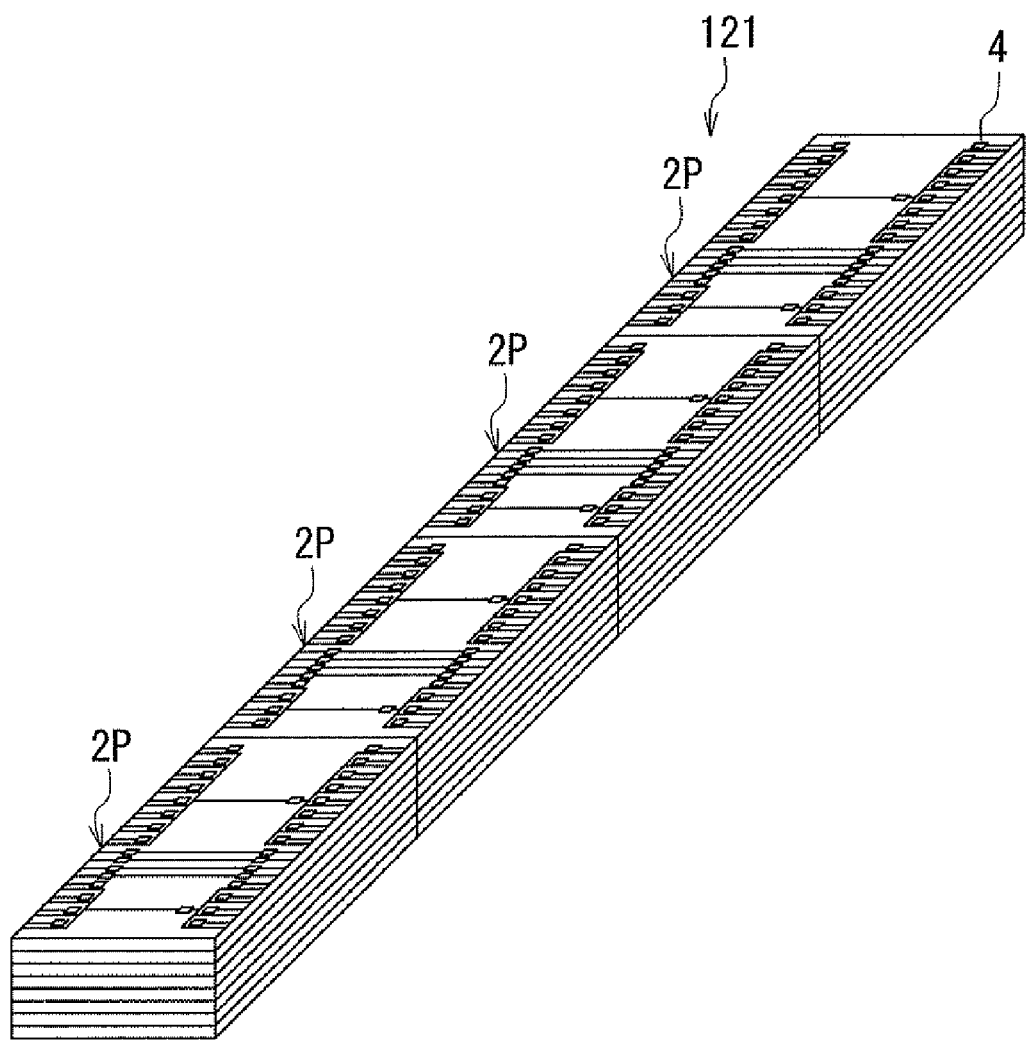
FIG. 28 is a perspective view showing an example of a block obtained by cutting the layered substructure.

FIG. 28 shows a step that follows the step shown in FIG. 26. In this step, the layered substructure 120 is cut into at least one block 121 in which a plurality of pre-separation main bodies 2P are arranged in a direction orthogonal to the stacking direction of the substructures 110. FIG. 28 shows an example of the block 121. In the block 121 shown in FIG. 28, four pre-separation main bodies 2P are arranged in the direction orthogonal to the stacking direction of the substructures 110. Each single pre-separation main body 2P includes eight preliminary layer portions 10P. The block 121 shown in FIG. 28 therefore includes 4×8, i.e., 32 preliminary layer portions 10P.

Figure 29:
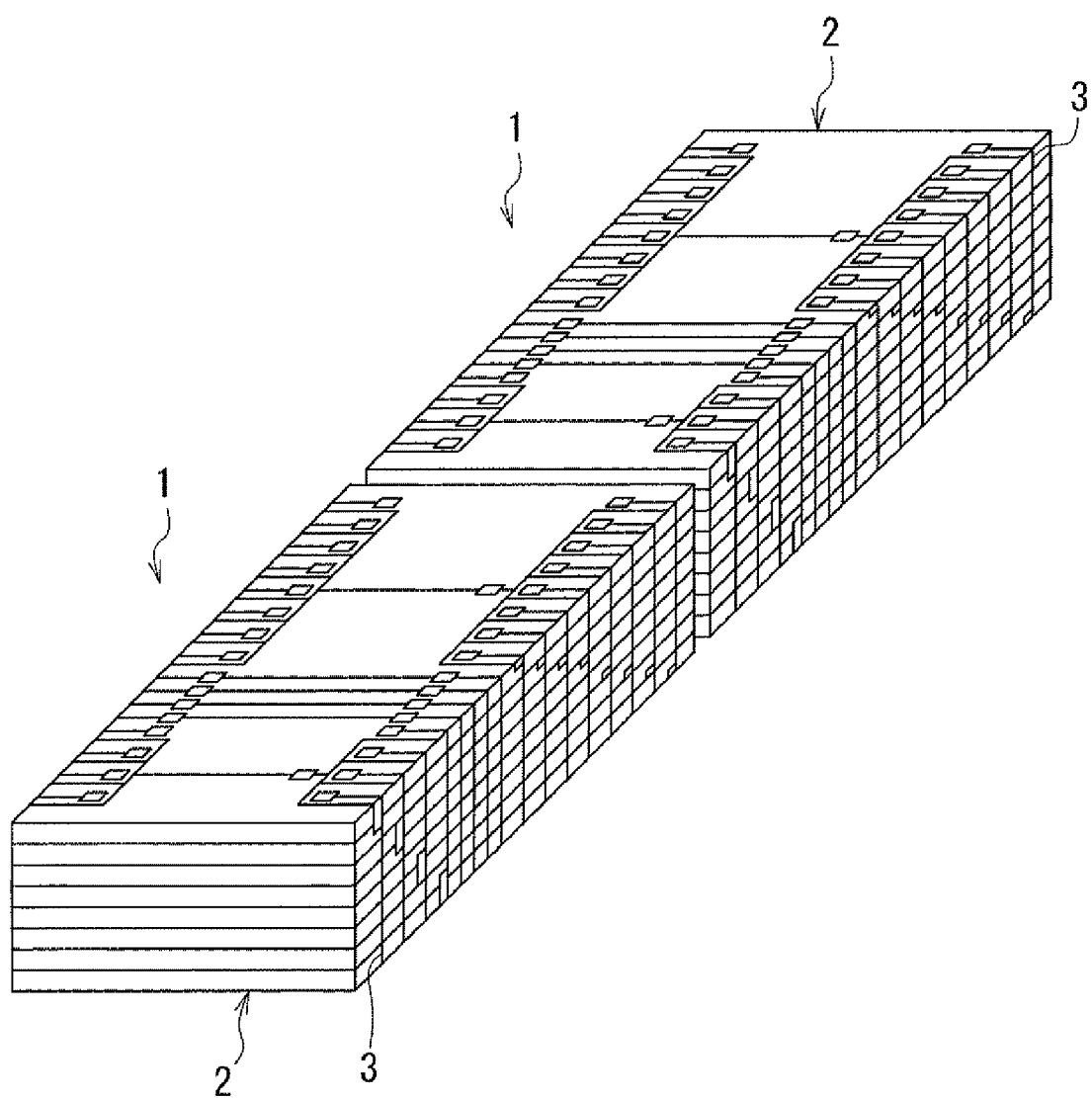
FIG. 29 is an explanatory diagram showing a step that follows the step shown in FIG. 28.

FIG. 29 shows a step that follows the step shown in FIG. 28. In this step, first, the wiring 3 is simultaneously formed on all the pre-separation main bodies 2P included in the block 121. In the case of forming the wiring 3 by plating, a seed layer for plating is formed first. Then, a photoresist layer is formed on the seed layer and the photoresist layer is patterned by photolithography to form a frame having a plurality of openings in which a plurality of units of wiring 3 corresponding to the plurality of pre-separation main bodies 2P are to be accommodated later. Next, plating layers to constitute portions of the wiring 3 are formed by plating on the seed layer in the openings of the frame. The frame is then removed, and portions of the seed layer other than those lying under the plating layers are also removed by etching. The plating layers and the remaining portions of the seed layer under the plating layers thus form the wiring 3. The wiring 3 is formed for each of the pre-separation main bodies 2P.

In the step shown in FIG. 29, the block 121 is then cut at positions of boundaries between every two pre-separation main bodies 2P that are adjacent to each other in the direction orthogonal to the stacking direction of the substructures 110, so as to produce a plurality of layered chip packages 1. As a result, the pre-separation main bodies 2P become individual main bodies 2, and a plurality of layered chip packages 1 each of which includes the main body 2 and the wiring 3 are thereby produced.

The plurality of layered chip packages 1 are thus formed through the series of steps that have been described with reference to FIG. 12 to FIG. 29. So far the description has dealt with the case where the layered substructure 120 including eight substructures 110 shown in FIG. 26 is used to form a plurality of layered chip packages 1 each of which includes eight layer portions 10. In the present embodiment, however, the number of the substructures 110 to be included in the layered substructure 120 can be changed to form a plurality of types of layered chip packages 1 with different numbers of layer portions 10. Moreover, in the present embodiment, a structure composed of a single substructure 110 with a plurality of second additional portion terminals 55 formed on its bottom surface may be fabricated instead of the layered substructure 120, and such a structure may be used instead of the layered substructure 120 to form a plurality of packages each of which includes only a single layer portion 10, through the series of steps described with reference to FIG. 28 and FIG. 29. It is thereby possible to form a plurality of additional portions 51 such as ones shown in FIG. 6 and FIG. 7.

As has been described, the layered chip package 1 according to the present embodiment has the wiring 3 including a plurality of wires W disposed on at least one of the side surfaces of the main body 2. The main body 2 has the main part 2M, the plurality of first terminals 4, and the plurality of second terminals 5. The main part 2M includes a plurality of layer portions 10 stacked on one another. The first terminals 4 are disposed on the top surface 2Ma of the main part 2M. The second terminals 4 are disposed on the bottom surface 2Mb of the main part 2M. Both the first and second terminals 4 and 5 are electrically connected to the plurality of wires W. With the layered chip package 1 of such a configuration, it is possible to establish electrical connection between two or more layered chip packages 1 by stacking the two or more layered chip packages 1 on each other and electrically connecting the second terminals 5 of the upper one of two vertically adjacent layered chip packages 1 to the first terminals 4 of the lower one.

Each layer portion 10 includes a semiconductor chip 30, and a plurality of electrodes electrically connected to the plurality of wires W. In the present embodiment, the layer portion L11 (the first layer portion) located closest to the top surface 2Ma of the main part 2M and the layer portion L18 (the second layer portion) located closest to the bottom surface 2Mb of the main part 2M are arranged so that the second surfaces 30b of their respective semiconductor chips 30 face toward each other. The plurality of first terminals 4 are formed by using the plurality of electrodes of the layer portion L11. The plurality of second terminals 5 are formed by using the plurality of electrodes of the layer portion L18. The present embodiment thus allows the plurality of first terminals 4 and the plurality of second terminals 5 to be formed easily.

Consequently, according to the present embodiment, a plurality of layered chip packages 1 that are able to be stacked on each other and electrically connected to each other are obtainable at low cost. This makes it possible to provide a package including a desired number of semiconductor chips 30 at low cost.

In the present embodiment, the plurality of electrodes are arranged in the same layout in the plurality of layer portions 10. The plurality of electrodes include a plurality of first terminal component parts that are used to form the plurality of first terminals 4 in the layer portion L11, and a plurality of second terminal component parts that are used to form the plurality of second terminals 5 in the layer portion L18. According to the present embodiment, different areas of the plurality of electrodes of the same layout can thus be used to form the first terminals 4 and the second terminals 5. This can further reduce the manufacturing costs of the layered chip package 1.

According to the present embodiment, if the main package 1 (the layered chip package 1) includes one or more second-type layer portions 10B, one or more additional portions 51 to substitute for the one or more layer portions 10B can be stacked on and electrically connected to the main package 1 to thereby form a composite layered chip package. Thus, according to the present embodiment, even if the main package 1 includes a defective semiconductor chip 30, it is possible to easily provide a composite layered chip package having the same functions as those of a layered chip package 1 that includes no defective semiconductor chip 30.

Figure 30:
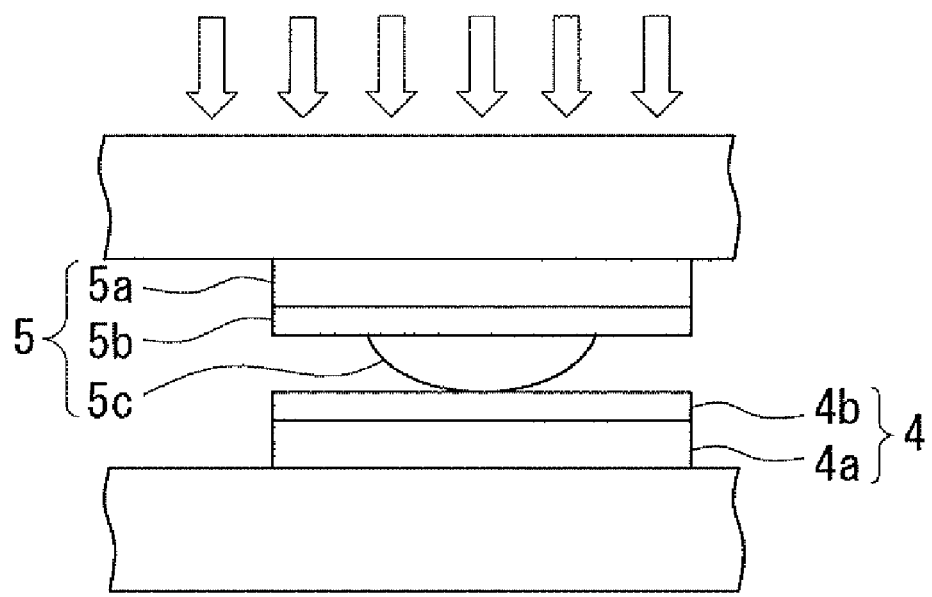
FIG. 30 is a side view showing connecting parts of the terminals of two vertically adjacent layered chip packages.
Figure 31:
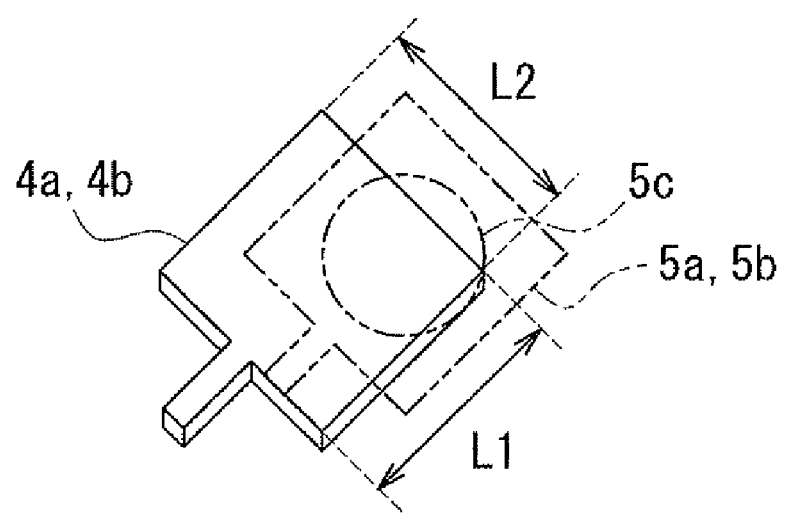
FIG. 31 is an explanatory diagram for explaining misalignment between the terminals of two vertically adjacent layered chip packages.

Moreover, the present embodiment facilitates the alignment between every two vertically adjacent layered chip packages 1 when stacking a plurality of layered chip packages 1 on each other. This advantageous effect will now be described with reference to FIG. 30 and FIG. 31. FIG. 30 is a side view showing connecting parts of the terminals of two vertically adjacent layered chip packages 1. FIG. 31 is an explanatory diagram for explaining misalignment between the terminals of two vertically adjacent layered chip packages 1.

In the example shown in FIG. 30 and FIG. 31, the terminal 4 includes a conductor pad 4a of rectangular shape and an Au layer 4b that is formed on the surface of the conductor pad 4a. The conductor pad 4a constitutes a part of the electrode, and is made of Cu, for example. The terminal 5 includes a conductor pad 5a of rectangular shape, an underlayer 5b formed on the surface of the conductor pad 5a, and a solder layer 5c formed on the surface of the underlayer 5b. The conductor pad 5a constitutes a part of the electrode, and is made of Cu, for example. The underlayer 5b is made of Au, and the solder layer 5c is made of AuSn. Alternatively, contrary to this example, it is possible that the terminal 4 includes a conductor pad, an underlayer and a solder layer, while the terminal 5 includes a conductor pad and an Au layer. Both of the terminals 4 and 5 may include a solder layer. Here, the lengths of two orthogonal sides of the conductor pad 4a will be represented by L1 and L2. L1 and L2 are both 40 to 80 µm, for example. The conductor pad 5a has the same shape as that of the conductor pad 4a.

In the example shown in FIG. 30, the corresponding terminals 4 and 5 of the two vertically adjacent layered chip packages 1 are electrically connected in the following way. The Au layer 4b and the solder layer 5c of the corresponding terminals 4 and 5 are put into contact with each other. By applying heat and pressure, the solder layer 5c is melted, and then solidified to bond the terminals 4 and 5 to each other.

FIG. 31 shows a state where the terminals 4 and 5 are out of alignment. The state where the terminals 4 and 5 are out of alignment refers to the state where the edges of the conductor pad 4a and those of the conductor pad 5a do not coincide in position with each other when viewed in a direction perpendicular to the plane of the conductor pads 4a and 5a. In the present embodiment, the corresponding terminals 4 and 5 may be out of alignment as long as the terminals 4 and 5 can be bonded with a sufficiently small resistance at the interface between the terminals 4 and 5. Assuming that L1 and L2 are 30 to 60 µm, the maximum permissible misalignment between the terminals 4 and 5 is smaller than L1 and L2 yet several tens of micrometers.

According to the present embodiment, some misalignment between the terminals 4 and 5 is thus acceptable when stacking a plurality of layered chip packages 1. This facilitates the alignment between two vertically adjacent layered chip packages 1. Consequently, according to the present embodiment, it is possible to reduce the manufacturing cost of an electronic component that includes a stack of a plurality of layered chip packages 1.

For the same reason as with the stacking of a plurality of layered chip packages 1 as described above, the present embodiment facilitates alignment between the main package 1 and an additional portion 51 that are adjacent vertically or alignment between two vertically adjacent additional portions 51 when the main package 1 and one or more additional portions 51 are stacked to form a composite layered chip package. Consequently, according to the present embodiment, it is possible to reduce the manufacturing cost of the composite layered chip package.

Figure 32:
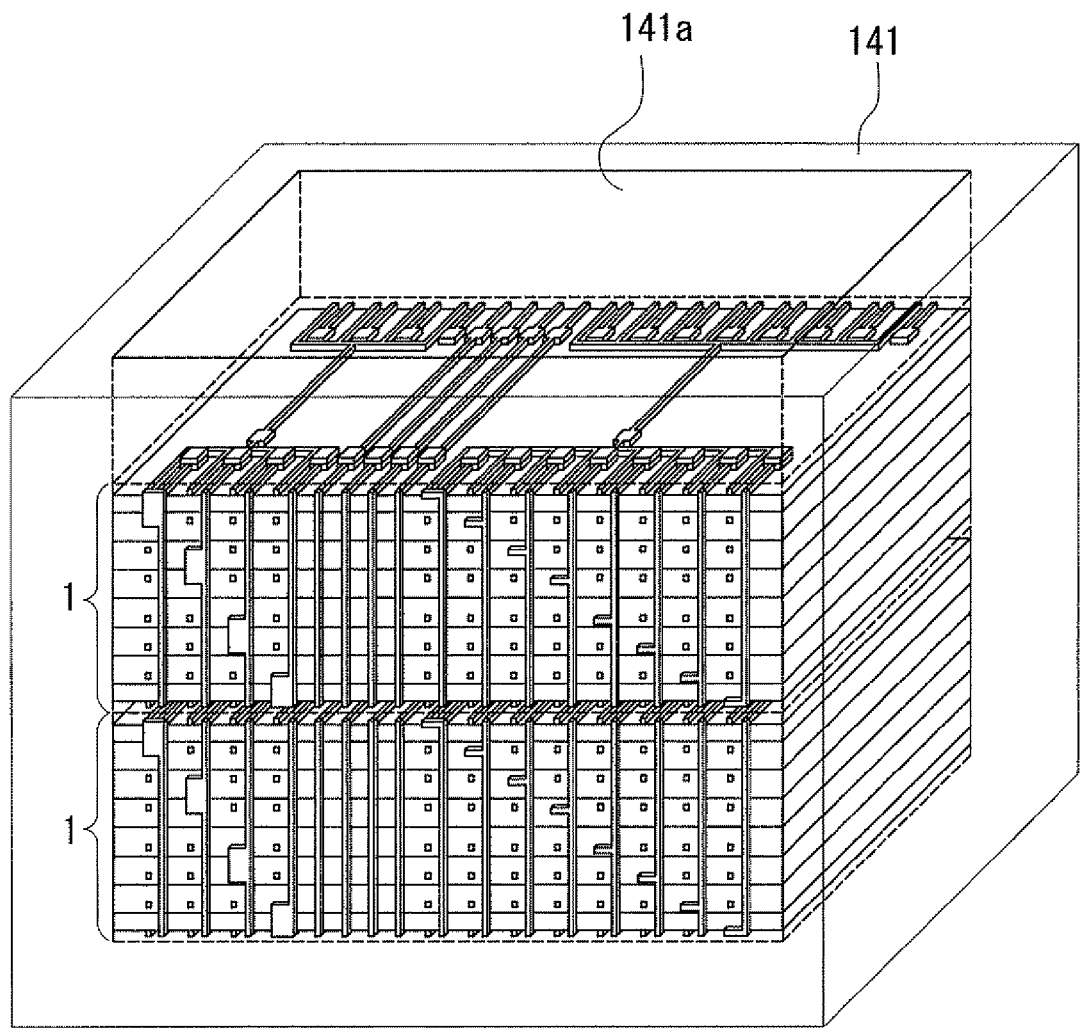
FIG. 32 is a perspective view showing an example of the method of stacking two layered chip packages.

FIG. 32 shows an example of a method of manufacturing an electronic component that includes a stack of a plurality of layered chip packages 1. The method shown in FIG. 32 uses a heatproof container 141. The container 141 has an accommodating part 141*a* in which a plurality of layered chip packages 1 can be stacked and accommodated. The accommodating part 141*a* has such a size that the side surfaces of the layered chip packages 1 accommodated in the accommodating part 141*a* and the inner walls of the accommodating part 141*a* leave a slight gap therebetween. In the method, a plurality of layered chip packages 1 are stacked and accommodated in the accommodating part 141*a* of the container 141, and then the container 141 and the plurality of layered chip packages 1 are heated at temperatures at which the solder layer melts (for example, 320° C.). This melts the solder layer, whereby the terminals 4 and 5 of every two vertically adjacent layered chip packages 1 are bonded to each other. According to the method, a plurality of layered chip packages 1 are stacked and accommodated in the accommodating part 141*a* of the container 141, whereby the plurality of layered chip packages 1 can be easily aligned with each other. This makes it easy to manufacture an electronic component that includes a stack of the plurality of layered chip packages 1. FIG. 32 shows an example where two layered chip packages 1 are stacked.

The method shown in FIG. 32 can also be used when manufacturing a composite layered chip package by stacking the main package 1 and one or more additional portions 51. Using the method shown in FIG. 32 to manufacture a composite layered chip package allows easy manufacture of the composite layered chip package.

In the present embodiment, defective semiconductor chips 30 are not electrically connected to the wiring 3. The defective semiconductor chips 30 may thus be regarded as a mere insulating layer. Consequently, according to the present embodiment, it is possible to disable the defective semiconductor chips 30 and to prevent the defective semiconductor chips 30 from causing malfunction of the layered chip package.

According to the present embodiment, even if the second-type layer portion 10B is the uppermost in the main package 1 (layered chip package 1), it is still possible to form the plurality of first terminals 4 by using the plurality of electrodes. This makes it possible to stack an additional portion 51 on the top of the main package 1 and electrically connect the plurality of first terminals 4 of the main package 1 to the plurality of second additional portion terminals 55 of the additional portion 51. Likewise, even if the second-type layer portion 10B is the lowermost in the main package 1 (layered chip package 1), it is still possible to form the plurality of second terminals 5 by using the plurality of electrodes. This makes it possible to stack the main package 1 on the top of an additional portion 51 and electrically connect the plurality of second terminals 5 of the main package 1 to the plurality of first additional portion terminals 54 of the additional portion 51. The plurality of electrodes of the layer portion 10B do not have the function of electrically connecting the semiconductor chip 30 to the wiring 3, but have an interposer function of electrically connecting the main package 1 and an additional portion 51 to each other.

Each layer portion 10 includes the first-type and sixth-type electrodes that are used for electrical connection to the semiconductor chip 30, and the second- to fifth-type electrodes that are not in contact with the semiconductor chip 30. Regardless of whether the uppermost or lowermost layer portion 10 (the first or second layer portion) is the first-type layer portion 10A or the second-type layer portion 10B, the plurality of electrodes except for the first-type and sixth-type electrodes do not have the function of electrically connecting the semiconductor chip 30 to the wiring 3, but have an interposer function of electrically connecting the main package 1 (layered chip package 1) and an additional portion 51 to each other.

In the present embodiment, the plurality of wires W include a plurality of common wires WA that are used for a purpose common to all the layer portions 10 in the main part 2M, and a plurality of layer-dependent wires WB that are used by different ones of the plurality of layer portions 10. As shown in FIG. 1 and FIG. 2, each layer-dependent wire WB is broadened in part, and is thereby electrically connected to the sixth-type electrode 32D1 or 32D2 of the layer portion 10 that uses the layer-dependent wire WB. Such a configuration of the present embodiment allows the semiconductor chips 30 to be electrically connected to respective different layer-dependent wires WB from one layer portion 10 to another while allowing the electrodes 32D1 and 32D2 to have the same layout in all the layer portions 10 in the main part 2M. This allows easy manufacture of the layered chip package 1.

In the composite layered chip package according to the present embodiment, the additional portion 51 includes at least one additional semiconductor chip 80 and additional portion wiring 53. The additional portion wiring 53 defines electrical connections between the at least one additional semiconductor chip 80 and the plurality of first terminals 4 or second terminals 5 of the main package 1 so that the at least one additional semiconductor chip 80 substitutes for the semiconductor chip 30 of at least one second-type layer portion 10B. Consequently, according to the present embodiment, it is possible to easily provide a composite layered chip package having the same functions as those of a layered chip package 1 that includes no defective semiconductor chip 30, regardless of the number and location(s) of the second-type layer portion(s) 10B in the main package 1. The location(s) of the second-type layer portion(s) 10B in the main package 1 can be known from the location information on non-malfunctioning pre-semiconductor-chip portions 30P and malfunctioning pre-semiconductor-chip portions 30P which was obtained by the wafer sort test.

The method of manufacturing the layered chip packages 1 according to the present embodiment includes the steps of: fabricating a layered substructure 120 by stacking three or more substructures 110; and producing a plurality of layered chip packages 1 from the layered substructure 120. In the step of fabricating the layered substructure 120, the layered substructure 120 is fabricated such that the respective second surfaces 30*b* of two of the three or more substructures 110 face toward each other, the two of the three or more substructures 110 being located at opposite ends in the stacking direction of the three or more substructures 110.

According to such a method of manufacturing the layered chip packages 1, it is possible to simultaneously form a plurality of sets of the terminals 4 and 5 corresponding to a plurality of layered chip packages 1 in the step of fabricating the layered substructure 120. In addition, according to this manufacturing method, the wiring 3 is formed simultaneously on a plurality of pre-separation main bodies 2P included in the block 121 in the process described with reference to FIG. 28 and FIG. 29. This allows forming a plurality of units of wiring 3 corresponding to a plurality of layered chip packages 1 simultaneously. Here, it is unnecessary to perform alignment between the plurality of pre-separation main bodies 2P included in the block 121. Consequently, this manufacturing method allows the layered chip package 1 to be mass-produced at low cost in a short time. A plurality of layered chip packages 1 produced by the method can be electrically connected to each other easily.

The foregoing method of manufacturing the layered chip packages 1 achieves a reduction in the number of steps and consequently allows a reduction in cost of the layered chip packages 1, as compared with the method of manufacturing a layered chip package disclosed in U.S. Pat. No. 5,953,588.

In the foregoing method of manufacturing the layered chip packages 1, the first and second stacks are fabricated by the method that has been described with reference to FIG. 21 to FIG. 25. This allows the plurality of substructures 110 making up the first and second stacks to be reduced in thickness easily while preventing damage to the substructures 110. The present embodiment thus makes it possible to manufacture a compact and highly integrated layered chip package 1 with a high yield.

According to the present embodiment, in the layered chip package 1 including a plurality of semiconductor chips 30 stacked, the stacked semiconductor chips 30 are electrically connected to each other by the wiring 3 (the plurality of wires W) disposed on at least one of the side surfaces of the main body 2. Consequently, the present embodiment is free from the problems of the wire bonding method, that is, the problem that it is difficult to reduce the distance between the electrodes so as to avoid contact between the wires, and the problem that the high resistances of the wires hamper quick circuit operation.

As compared with the through electrode method, the present embodiment has the following advantages. First, the present embodiment does not require the formation of through electrodes in each chip and consequently does not require a large number of steps for forming through electrodes in each chip. Moreover, the present embodiment provides higher reliability of electrical connection between a plurality of chips as compared with the case where through electrodes are used to establish electrical connection between the chips.

Furthermore, according to the present embodiment, it is possible to easily change the line width and thickness of the wiring 3. Consequently, it is possible to easily cope with future demands for finer wiring 3.

The through electrode method requires that the through electrodes of vertically adjacent chips be connected to each other by means of, for example, soldering at high temperatures. In contrast, according to the present embodiment, it is possible to form the wiring 3 at lower temperatures since the wiring 3 can be formed by plating. According to the present embodiment, it is also possible to bond the plurality of layer portions 10 to each other at low temperatures. Consequently, it is possible to prevent the chips 30 from suffering damage from heat.

The through electrode method further requires accurate alignment between vertically adjacent chips in order to connect the through electrodes of the vertically adjacent chips to each other. In contrast, according to the present embodiment, electrical connection between a plurality of semiconductor chips 30 is established not at an interface between two vertically adjacent layer portions 10 but through the use of the wiring 3 disposed on at least one of the side surfaces of the main body 2. The alignment between a plurality of layer portions 10 therefore requires lower accuracy than that required for the alignment between a plurality of chips in the through electrode method.

Second Embodiment

Figure 33:
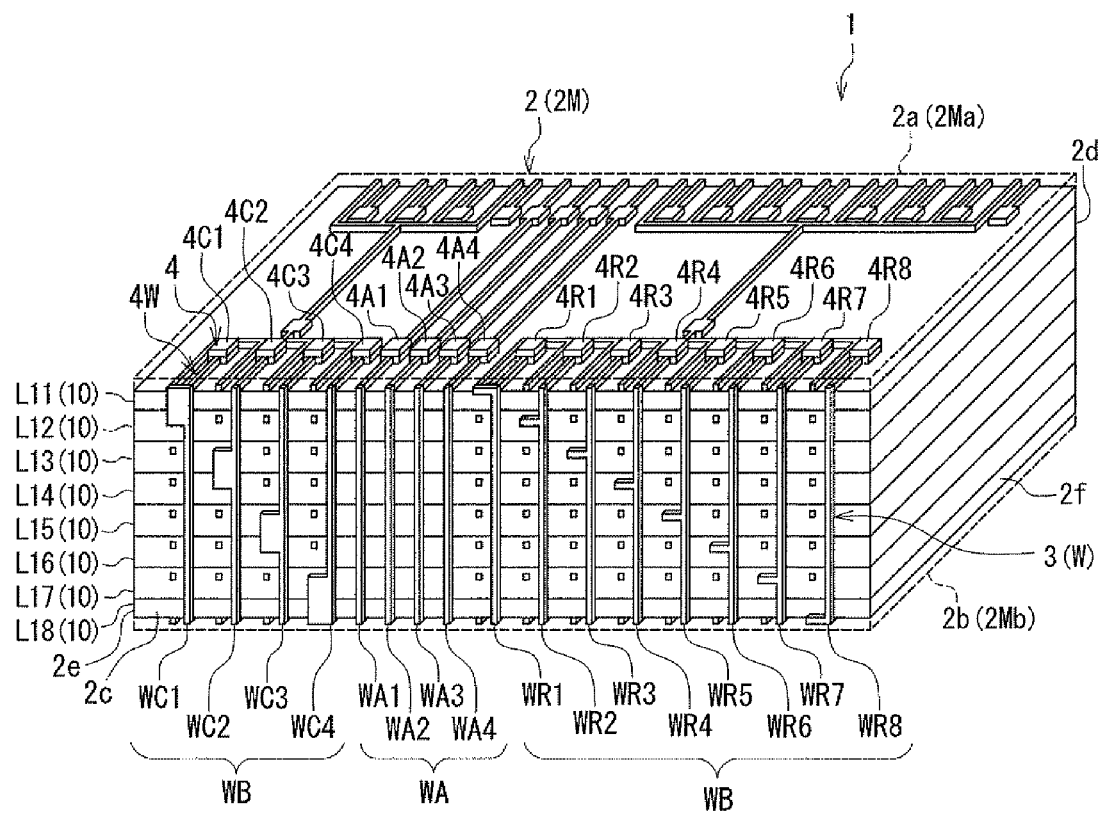
FIG. 33 is a perspective view of a layered chip package according to a second embodiment of the invention.
Figure 34:
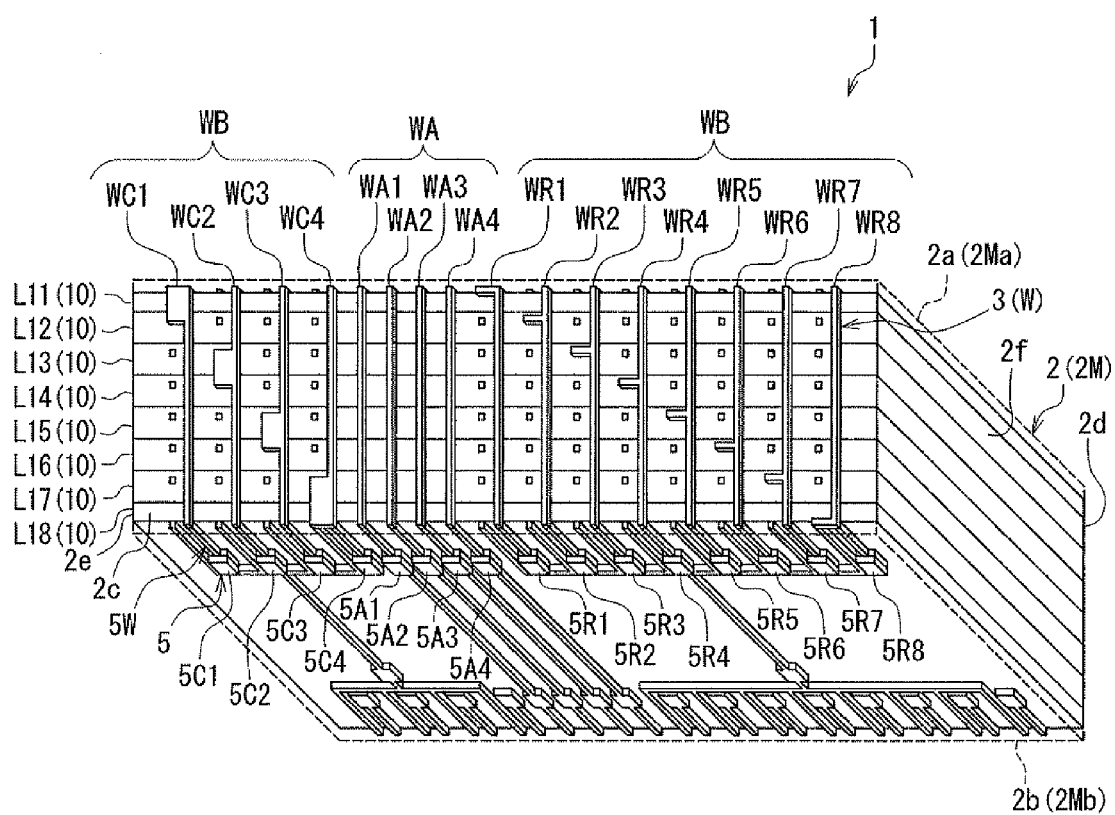
FIG. 34 is a perspective view showing the layered chip package of FIG. 33 as viewed from below.

A second embodiment of the invention will now be described. First, a description will be given of the configuration of a layered chip package according to the present embodiment with reference to FIG. 33 and FIG. 34. FIG. 33 is a perspective view of the layered chip package according to the present embodiment. FIG. 34 is a perspective view showing the layered chip package of FIG. 33 as viewed from below.

The configuration of the layered chip package 1 according to the present embodiment is basically the same as in the first embodiment. In the present embodiment, the layer portions L15 to L17 in the main part 2M are arranged in orientations different from those in the first embodiment. In the present embodiment, the layer portions L15 to L17 in the main part 2M are arranged in the same orientation as that of the layer portion L11 of the first embodiment shown in FIG. 5. More specifically, in the present embodiment, the layer portions L11 to L17 are arranged with the first surfaces 30a of the semiconductor chips 30 upward and the side surfaces 30c, 30d, 30e, and 30f of the semiconductor chips 30 toward the side surfaces 2c, 2d, 2e, and 2f of the main body 2, respectively. Only the layer portion L18 is arranged with the first surface 30a of the semiconductor chip 30 downward and the side surfaces 30d, 30c, 30e, and 30f of the semiconductor chip 30 toward the side surfaces 2c, 2d, 2e, and 2f of the main body 2, respectively.

In the present embodiment, the arrangement of the first and second connection parts of the plurality of electrodes of the layer portions L15 to L17 is different from that in the first embodiment. More specifically, in the layer portions L15 to L17, the first connection parts 37A1 to 37A4 of the first-type electrodes 32A1 to 32A4 are located in the first side surface 2c of the main body 2 and are in contact with the wires WA1 to WA4, respectively. Furthermore, in the layer portions L15 to L17, the first connection parts 37D11 to 37D14 of the sixth-type electrodes 32D1 and the first connection parts 37D21 to 37D28 of the sixth-type electrodes 32D2 are located in the first side surface 2c of the main body 2. The wire WC3 is in contact with the first connection parts 37D13 in the layer portions L15 and L16. The wire WC4 is in contact with the first connection part 37D14 in the layer portion L17 and the second connection part 38D14 in the layer portion L18. The wire WR5 is in contact with the first connection part 37D25 in the layer portion L15. The wire WR6 is in contact with the first connection part 37D26 in the layer portion L16. The wire WR7 is in contact with the first connection part 37D27 in the layer portion L17.

A method of manufacturing the layered chip packages 1 according to the present embodiment will now be described. In the method of manufacturing the layered chip packages 1 according to the present embodiment, after the formation of the first substructure 110 shown in FIG. 22, the same steps as those shown in FIG. 23 and FIG. 24 are repeated to form a stack including seven substructures 110 stacked on the jig 112.

Figure 35:
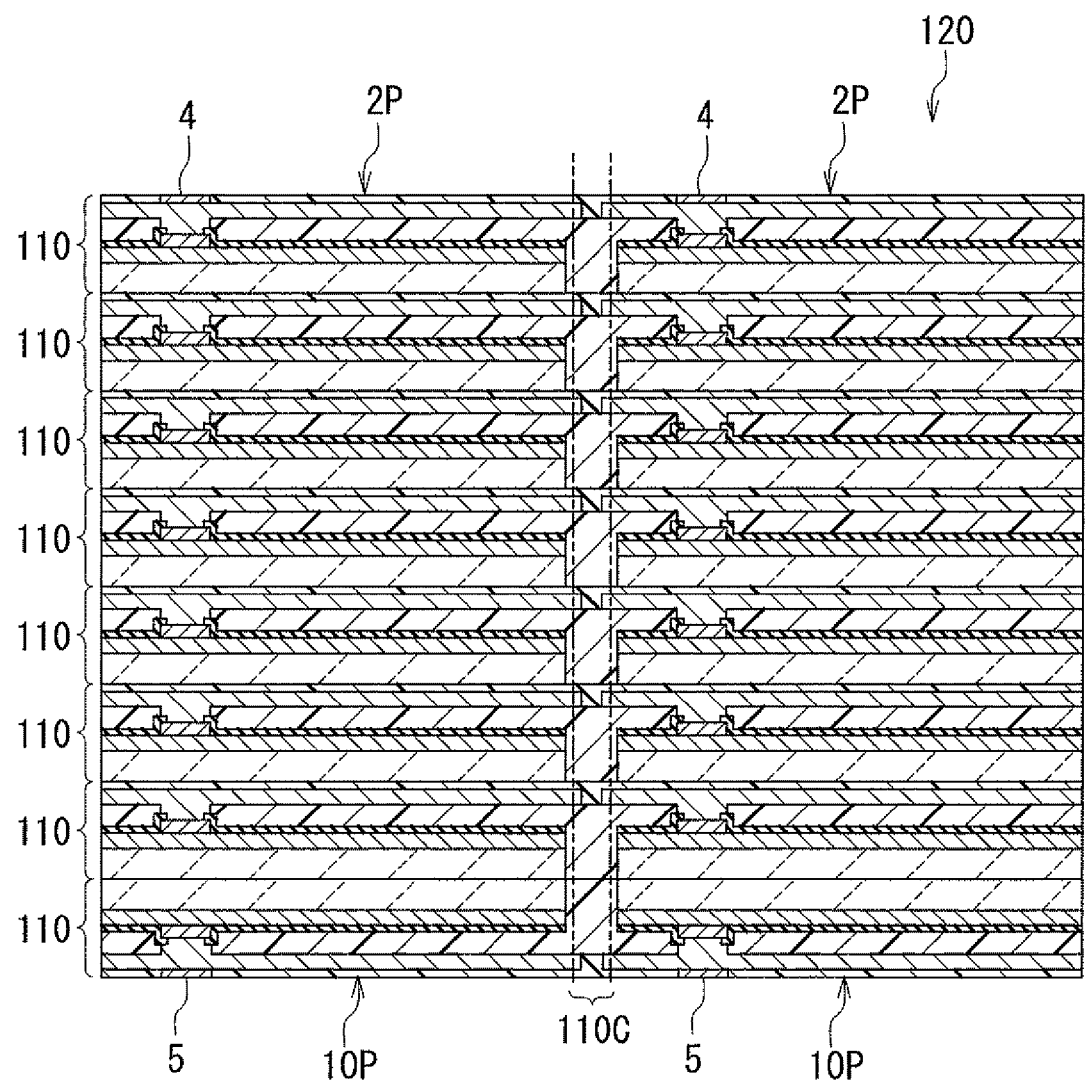
FIG. 35 is a cross-sectional view showing a layered substructure fabricated in a method of manufacturing the layered chip package according to the second embodiment of the invention.

Next, using the stack including the seven substructures 110 and another first substructure 110 bonded to a jig 120 shown in FIG. 22, a stack including eight substructures 110 stacked on one another is formed. More specifically, the stack including the eight substructures 110 is formed by bonding the stack including seven substructures 110 and the first substructure 110 to each other using an insulating adhesive (not shown), such that the second surface 110b of the first substructure 110 shown in FIG. 22 faces the second surface 110b of the last substructure 110 formed in the process of forming the stack including the seven substructures 110. The stack including the eight substructures 110 corresponds to the third stack of the first embodiment. Then, the layered substructure 120 shown in FIG. 35 is fabricated through the same subsequent steps as those in the first embodiment. The steps to be performed thereafter are the same as in the first embodiment.

The remainder of configuration, function and effects of the present embodiment are similar to those of the first embodiment.

The present invention is not limited to the foregoing embodiments, and various modifications may be made thereto. For example, the layer portions 10 except the first and second layer portions, i.e., the layer portions L12 to L17 may be arranged in orientations different from those described in the foregoing embodiments.

In the present invention, the wiring may include, as the plurality of lines, a plurality of through electrodes that pass (penetrate) through all the plurality of layer portions. In this case, the first and second connection parts of the plurality of electrodes are not exposed in the first side surface 2c of the main body 2 but are in contact with the through electrodes inside the main part 2M.

It is apparent that the present invention can be carried out in various forms and modifications in the light of the foregoing descriptions. Accordingly, within the scope of the following claims and equivalents thereof, the present invention can be carried out in forms other than the foregoing most preferred embodiments.

What is claimed is:

1. A layered chip package comprising a main body and wiring, wherein:
    the main body includes: a main part having a top surface and a bottom surface and including three or more layer portions stacked on one another; a plurality of first terminals disposed on the top surface of the main part; and a plurality of second terminals disposed on the bottom surface of the main part;
    the wiring includes a plurality of lines that are electrically connected to the plurality of first terminals and the plurality of second terminals and that pass through all the three or more layer portions;
    each of the three or more layer portions includes: a semiconductor chip having a first surface, and a second surface opposite to the first surface; and a plurality of electrodes that are electrically connected to the wiring;
    in at least one of the three or more layer portions, the plurality of electrodes are electrically connected to the semiconductor chip;
    the plurality of electrodes are disposed on a side of the first surface of the semiconductor chip;
    the three or more layer portions include a first layer portion that is located closest to the top surface of the main part, and a second layer portion that is located closest to the bottom surface of the main part;
    the first layer portion and the second layer portion are arranged so that the second surfaces of their respective semiconductor chips face toward each other;
    the plurality of first terminals are formed by using the plurality of electrodes of the first layer portion; and
    the plurality of second terminals are formed by using the plurality of electrodes of the second layer portion.

2. The layered chip package according to claim 1, wherein:
    the plurality of electrodes are arranged in the same layout in the three or more layer portions; and
    the plurality of electrodes include a plurality of first terminal component parts that are used to form the plurality of first terminals in the first layer portion, and a plurality of second terminal component parts that are used to form the plurality of second terminals in the second layer portion.

3. The layered chip package according to claim 2, wherein the plurality of electrodes further include one or more connection parts for electrically connecting one of the first terminal component parts to one of the second terminal component parts.

4. The layered chip package according to claim 1, wherein:
    the plurality of electrodes include a plurality of chip connection electrodes for electrical connection to the semiconductor chip; and
    in at least one of the three or more layer portions, the plurality of chip connection electrodes are in contact with and electrically connected to the semiconductor chip.

5. The layered chip package according to claim 1, wherein the plurality of electrodes include one or more electrodes that are not used to form any of the plurality of first terminals and the plurality of second terminals.

6. The layered chip package according to claim 1, wherein:
    the plurality of lines include a plurality of common lines that are used for a purpose common to all the layer portions in the main part, and a plurality of layer-dependent lines that are used by different ones of the layer portions;
    the plurality of electrodes include a plurality of common electrodes that are electrically connected to the plurality of common lines, and a selective connection electrode that is selectively electrically connected to only one of the plurality of layer-dependent lines that is used by the layer portion to which the selective connection electrode belongs; and
    in at least one of the three or more layer portions, the plurality of common electrodes and the selective connection electrode are electrically connected to the semiconductor chip, whereby the semiconductor chip is electrically connected to the plurality of common lines and the one of the layer-dependent lines.

7. The layered chip package according to claim 1, wherein the semiconductor chip includes a plurality of memory cells.

8. A method of manufacturing a plurality of layered chip packages of claim 1, comprising the steps of:
    fabricating a layered substructure by stacking three or more substructures each of which includes a plurality of preliminary layer portions that are arrayed, each of the preliminary layer portions being intended to become any one of the three or more layer portions, the three or more substructures being intended to be cut later at positions of boundaries between every adjacent ones of the preliminary layer portions; and
    producing the plurality of layered chip packages from the layered substructure, wherein:
    each of the three or more substructures has a first surface and a second surface that correspond to the first surface and the second surface of the semiconductor chip, respectively; and
    in the step of fabricating the layered substructure, the layered substructure is fabricated such that the respective second surfaces of two of the three or more substructures face toward each other, the two of the three or more substructures being located at opposite ends in a stacking direction of the three or more substructures.

* * * * *